(12) United States Patent
Ku et al.

(10) Patent No.: US 11,201,168 B2
(45) Date of Patent: Dec. 14, 2021

(54) SEMICONDUCTOR DEVICES INCLUDING FLARED SOURCE STRUCTURES

(71) Applicant: SAMSUNG ELECTRONICS CO., LTD., Suwon-si (KR)

(72) Inventors: Lee Eun Ku, Seoul (KR); Jae Ho Jeong, Suwon-si (KR); Woo Sung Yang, Gwangmyeong-si (KR); Jung Hwan Lee, Seoul (KR); In Su Noh, Hwaseong-si (KR); Sun Young Lee, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/735,085

(22) Filed: Jan. 6, 2020

(65) Prior Publication Data
US 2020/0144290 A1 May 7, 2020

Related U.S. Application Data

(63) Continuation of application No. 15/869,766, filed on Jan. 12, 2018, now Pat. No. 10,529,734.

(30) Foreign Application Priority Data

Jun. 13, 2017 (KR) .................. 10-2017-0073925

(51) Int. Cl.
*H01L 27/1157* (2017.01)
*H01L 27/11565* (2017.01)
(Continued)

(52) U.S. Cl.
CPC .... *H01L 27/11582* (2013.01); *H01L 27/1157* (2013.01); *H01L 27/11519* (2013.01);
(Continued)

(58) Field of Classification Search
CPC .......... H01L 27/11565; H01L 27/1157; H01L 27/11519; H01L 27/11524
See application file for complete search history.

(56) References Cited

U.S. PATENT DOCUMENTS

| 8,987,908 B2 | 3/2015 | Lee et al. |
| 9,012,976 B2 | 4/2015 | Tanaka |

(Continued)

FOREIGN PATENT DOCUMENTS

| KR | 20110133926 | 12/2011 |
| KR | 1020150057254 | 5/2015 |

(Continued)

OTHER PUBLICATIONS

Communication dated Jun. 30, 2021, issued by the Korean Patent Office in counterpart Korean Patent Application No. 10-2017-0073925.

*Primary Examiner* — Phat X Cao
(74) *Attorney, Agent, or Firm* — Sughrue Mion, PLLC

(57) ABSTRACT

A semiconductor device includes a structure including gate electrodes and interlayer insulating layers alternately stacked on an upper surface of a substrate, trenches passing through the structure; and a groove passing through a portion of the structure. The gate electrodes include word lines, and first and second select lines. The word lines are stacked in a vertical direction upwardly from the upper surface of the substrate. The first and second select lines are on the word lines, and are spaced apart from each other in a first horizontal direction parallel to the upper surface of the substrate. The trenches include a first trench and a second trench spaced apart from the first trench. The groove is on the word lines. The groove and a portion of the first trench are between the first select line and the second select line. The second trench is spaced apart from the select lines.

17 Claims, 26 Drawing Sheets

(51) Int. Cl.
*H01L 27/11519* (2017.01)
*H01L 27/11582* (2017.01)
*H01L 27/11524* (2017.01)
*H01L 27/11575* (2017.01)
*H01L 27/11573* (2017.01)

(52) U.S. Cl.
CPC .. *H01L 27/11524* (2013.01); *H01L 27/11565* (2013.01); *H01L 27/11573* (2013.01); *H01L 27/11575* (2013.01)

(56) References Cited

U.S. PATENT DOCUMENTS

| | | | |
|---|---|---|---|
| 9,190,514 B2 | 11/2015 | Lee et al. | |
| 9,196,627 B2 | 11/2015 | Konno et al. | |
| 9,306,040 B2 | 4/2016 | Choi et al. | |
| 9,397,043 B1* | 7/2016 | Minemura | H01L 27/11575 |
| 9,425,205 B2 | 8/2016 | Shimura | |
| 9,508,730 B2 | 11/2016 | Lee et al. | |
| 10,529,734 B2* | 1/2020 | Ku | H01L 27/11524 |
| 2011/0298013 A1 | 12/2011 | Hwang et al. | |
| 2012/0208347 A1 | 8/2012 | Hwang | |
| 2013/0009229 A1 | 1/2013 | Lee et al. | |
| 2014/0284687 A1 | 9/2014 | Murakami | |
| 2015/0137216 A1 | 5/2015 | Lee et al. | |
| 2015/0194435 A1 | 7/2015 | Lee | |
| 2015/0372101 A1 | 12/2015 | Lee et al. | |
| 2016/0064279 A1 | 3/2016 | Hyun | |
| 2016/0225783 A1 | 8/2016 | Ishibashi | |
| 2017/0207221 A1* | 7/2017 | Kim | H01L 27/11573 |
| 2017/0207232 A1 | 7/2017 | You | |
| 2017/0250194 A1 | 8/2017 | Lee | |
| 2017/0323900 A1 | 11/2017 | Kanamori | |
| 2018/0083030 A1* | 3/2018 | Yun | H01L 23/5226 |

FOREIGN PATENT DOCUMENTS

| KR | 10-2015-0081393 A | 7/2015 |
|---|---|---|
| KR | 1020160025866 | 3/2016 |

* cited by examiner

SEMICONDUCTOR DEVICES INCLUDING FLARED SOURCE STRUCTURES

CROSS-REFERENCE TO RELATED APPLICATION

This application is a Continuation of U.S. patent application Ser. No. 15/869,766, filed Jan. 12, 2018, which claims benefit of priority to Korean Patent Application No. 10-2017-0073925, filed on Jun. 13, 2017 in the Korean Intellectual Property Office, the disclosure of which is incorporated herein by reference in its entirety.

FIELD

The present inventive concept relates to the field of electronics and, more particularly, to semiconductor memory devices.

BACKGROUND

Semiconductor devices having a three-dimensional structure have been developed to increase the degree of integration of semiconductor devices. However, as the degree of integration of semiconductor devices increases, unexpected problems have arisen.

SUMMARY

An aspect of the present inventive concept may provide a semiconductor device including a plurality of source structures that may increase yield and productivity.

Embodiments according to the inventive concept can provide semiconductor devices including flared source structures. Pursuant to these embodiments, a semiconductor device can include a semiconductor substrate having a memory cell region and a pad region that is adjacent to the memory cell region, the pad region can include a first pad region, a second pad region between the memory cell region and the first pad region, and a buffer region that is between the first and second pad regions. A separation source structure can include a first portion and a second portion that are parallel to each other in a plan view of the semiconductor device. A first source structure and a second source structure can be disposed between the first and second portions of the separation source structure, where the first and second source structures can have end portions that oppose each other, the first source structure being disposed in the first pad region, and the second source structure being disposed in the second pad region. A gate group can be disposed in the memory cell region and the pad region between the first and second portions of the separation source structure, where each of the end portions of the first and second source structures has a planar shape, and a width of each end portion increases and then decreases as each of the end portions extends toward the other.

In some embodiments according to the inventive concept, a semiconductor device can include a semiconductor substrate including a memory cell region and a pad region, where the pad region including a first pad region and a second pad region between the memory cell region and the first pad region. A plurality of word lines stacked in the memory cell region in a vertical direction upwardly from a surface of the semiconductor substrate, the plurality of word lines extending in a first horizontal direction parallel to the surface of the semiconductor substrate to provide word line pads, and the word line pads being arranged in the first pad region to have a stepped shape. A plurality of string select lines disposed on the plurality of word lines in the memory cell region, extending in the first horizontal direction to provide string select line pads in the second pad region, and spaced apart from each other on a same plane. A first source structure disposed in the first pad region, a first vertical structure extending in the vertical direction to pass through the word line pads of the word lines. A second source structure disposed in the second pad region, a second vertical structure extending in the vertical direction to pass between string select line pads of the string select lines, where each of the first and second source structures includes end portions, the end portions opposing each other, and a width of each end portion increases and then decreases as each of the end portions extends toward the other.

In some embodiments according to the inventive concept, a semiconductor device can include a semiconductor substrate including a memory cell region and a pad region. A plurality of word lines can be sequentially stacked in the memory cell region, and extending to the pad region to provide word line pads, the word line pads being arranged in the pad region in a staircase arrangement, and the word lines being integrally connected to each other on a same plane. A plurality of string select lines can be disposed on the word lines in the memory cell region and extending to the pad region to provide string select line pads in the pad region, the string select lines being spaced apart from each other on a same plane. Source structures can be disposed in the pad region, where the source structures having end portions opposing each other, and each of the end portions of the source structures has a planar shape and a width of each end portion increases and then decreases as each of the end portions extends toward the other. One of the source structures can pass through the word line pads of the word lines and the other of the source structures can pass between the string select line pads, and passes through the plurality of word lines.

BRIEF DESCRIPTION OF DRAWINGS

The above, and other aspects, features, and advantages of the present disclosure will be more clearly understood from the following detailed description when taken in conjunction with the accompanying drawings, in which.

DETAILED DESCRIPTION OF EMBODIMENTS ACCORDING TO THE INVENTIVE CONCEPT

Embodiments according to the inventive concept are described hereinafter with reference to the accompanying drawings. The inventive concept may, however, be embodied in many different forms and should not be construed as limited to the embodiments set forth herein. Rather, these embodiments are provided so that this disclosure will be thorough and complete, and will fully convey the scope of the present inventive subject matter to those skilled in the art. Like numbers refer to like elements throughout.

Figure 1:
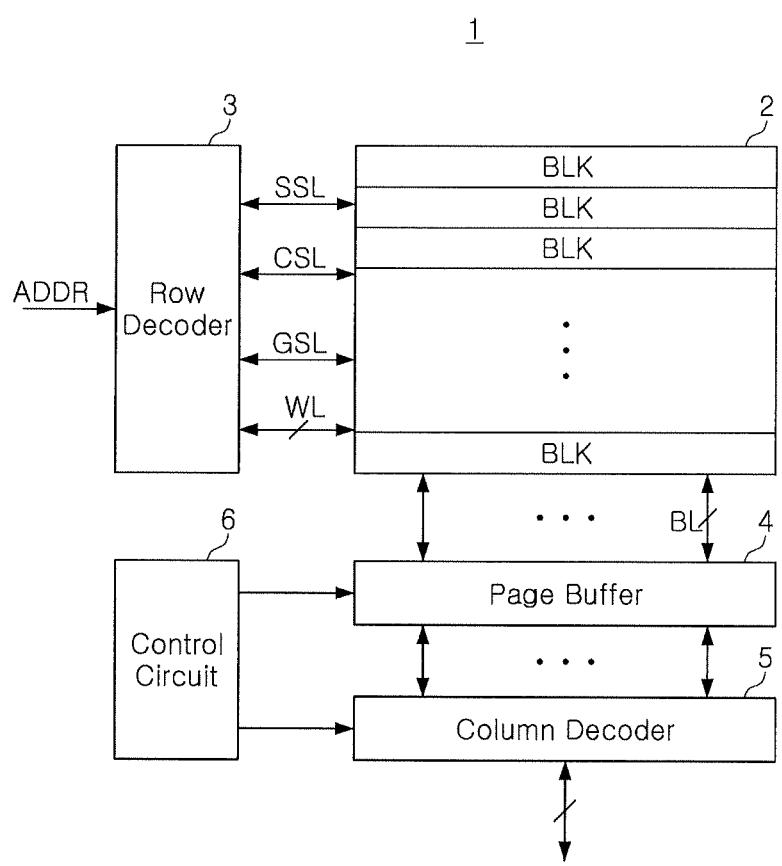
FIG. 1 is a block diagram of a semiconductor device in some embodiments according to the inventive concept.

FIG. 1 is a schematic block diagram of the semiconductor device 1, according to an example embodiment. Referring to FIG. 1, the semiconductor device 1 may include a memory cell array 2, a row decoder 3, a page buffer 4, a column decoder 5, and a control circuit 6. The memory cell array 2 may include a plurality of memory blocks (BLKs).

The memory cell array 2 may include a plurality of memory cells arranged in a plurality of rows and a plurality of columns. The memory cells, included in the memory cell array 2, may be electrically connected to the row decoder 3 through a plurality of word lines WLs, at least one common source line CSL, a plurality of string select lines SSLs, at least one ground select line GSL, and the like, and may be electrically connected to the page buffer 4 and the column decoder 5 through a plurality of bit lines BLs.

In an example embodiment, a plurality of memory cells arranged in the same row may be connected to a common word line WL, and a plurality of memory cells arranged in the same column may be connected to an identical bit line BL.

The row decoder 3 may be commonly connected to the memory blocks BLKs, and may provide a driving signal to word lines WLs of memory blocks BLKs selected in response to a block select signal. For example, the row decoder 3 may receive address ADDR information from an external source, and may decode the received ADDR information to determine a level of voltage supplied to at least a portion of the word lines WLs, the at least one common source line CSL, the string select lines SSLs, and the at least one ground select line GSL electrically connected to the memory cell array 2.

The page buffer 4 may be electrically connected to the memory cell array 2 through the bit lines BLs. The page buffer 4 may be connected to a bit line BL selected according to an address decoded by the column decoder 5. The page buffer 4 may temporarily store data to be stored in the memory cells, or may detect data stored in the memory cells, according to operation modes. For example, the page buffer 4 may operate as a write driver circuit in a data write mode, and as a sensing amplifier circuit in a data read mode.

The column decoder 5 may provide a data transmission path between the page buffer 4 and an external device (for example, a memory controller). The column decoder 5 may decode an address input from an external source to determine any one of the bit lines BLs. The column decoder 5 may be commonly connected to the memory blocks BLKs, and may provide data information to bit lines BLs of memory blocks BLKs selected in response to a block select signal.

The control circuit 6 may control the overall operations of the semiconductor device 1. The control circuit 6 may receive a control signal and an external voltage, and may operate in response to the received control signal. The control circuit 6 may include a voltage generator that generates voltages (for example, a data write voltage, a data read voltage, a data erase voltage, or the like) used for internal operations, using the external voltage. The control circuit 6 may control data reading, writing, and/or erasing operations in response to control signals.

Figure 2:
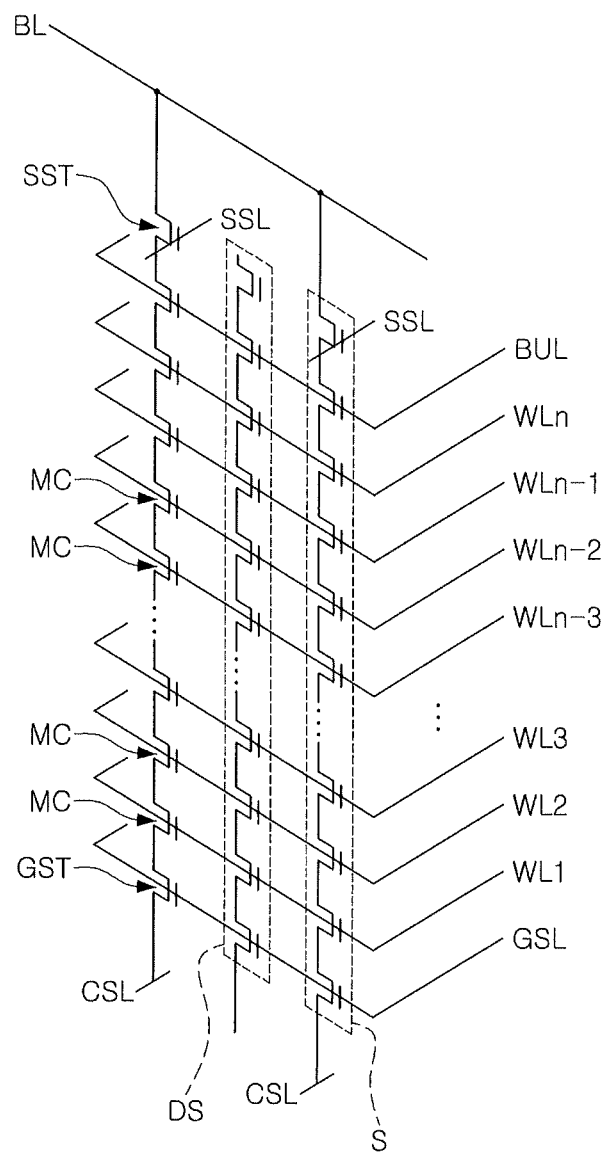
FIG. 2 is a circuit diagram illustrating a memory cell array of a semiconductor device, according to an example embodiment.

Referring to FIG. 2, an example of a circuit of the memory cell array 2 of the semiconductor device 1 described with reference to FIG. 1 will be described. FIG. 2 is a circuit diagram of the memory cell array 2 illustrated in FIG. 1.

Referring to FIG. 2, the memory cell array 2 of FIG. 1 may include a plurality of memory cell strings S, each including memory cells MCs connected to each other in series, and a ground select transistor GST and a string select transistor SST connected to opposing ends of the memory cells MCs in series. The memory cells MCs connected to each other in series may be connected to word lines WL1 to WLn for selecting the memory cells MCs, respectively. In an example embodiment, an n number of word lines WL1 to WLn may be provided.

A gate terminal of the ground select transistor GST may be connected to a ground select line GSL, and a source terminal of the ground select transistor GST may be connected to a common source line CSL. A gate terminal of the string select transistor SST may be connected to a string select line SSL, and a source terminal of the string select transistor SST may be connected to a drain terminal of the memory cells MCs. FIG. 2 illustrates a structure in which a single ground select transistor GST and a single string select transistor SST may be connected to the memory cells MCs connected to each other in series. In some embodiments, a plurality of ground select transistors GSTs or a plurality of string select transistors SSTs may also be connected to the memory cells MCs.

In an example embodiment, a dummy line or a buffer line BUL may be disposed between an uppermost word line WLn of the word lines WL1 to WLn and the string select line SSL.

A drain terminal of the string select transistor SST may be connected to a bit line BL. When a signal is applied to the gate terminal of the string select transistor SST through the string select line SSL, the signal applied through the bit line may be transmitted to the memory cells MCs connected to each other in series, and a data reading/writing operation may thus be performed. Further, a data erasing operation of erasing data stored in the memory cells MCs may be performed by applying a data erasing voltage having a certain level to the memory cells MCs through a substrate.

A semiconductor device, according to an example embodiment, may include at least one dummy string DS. The at least one dummy string DS may include a dummy channel electrically insulated from the bit line BL.

The semiconductor device, according to an example embodiment, may include a separation source structure, and source structures disposed between adjacent portions of the separation source structure while having opposing end portions. Examples of the semiconductor device, including the source structures, are described with reference to FIG. 3 through FIG. 11.

Figure 3:
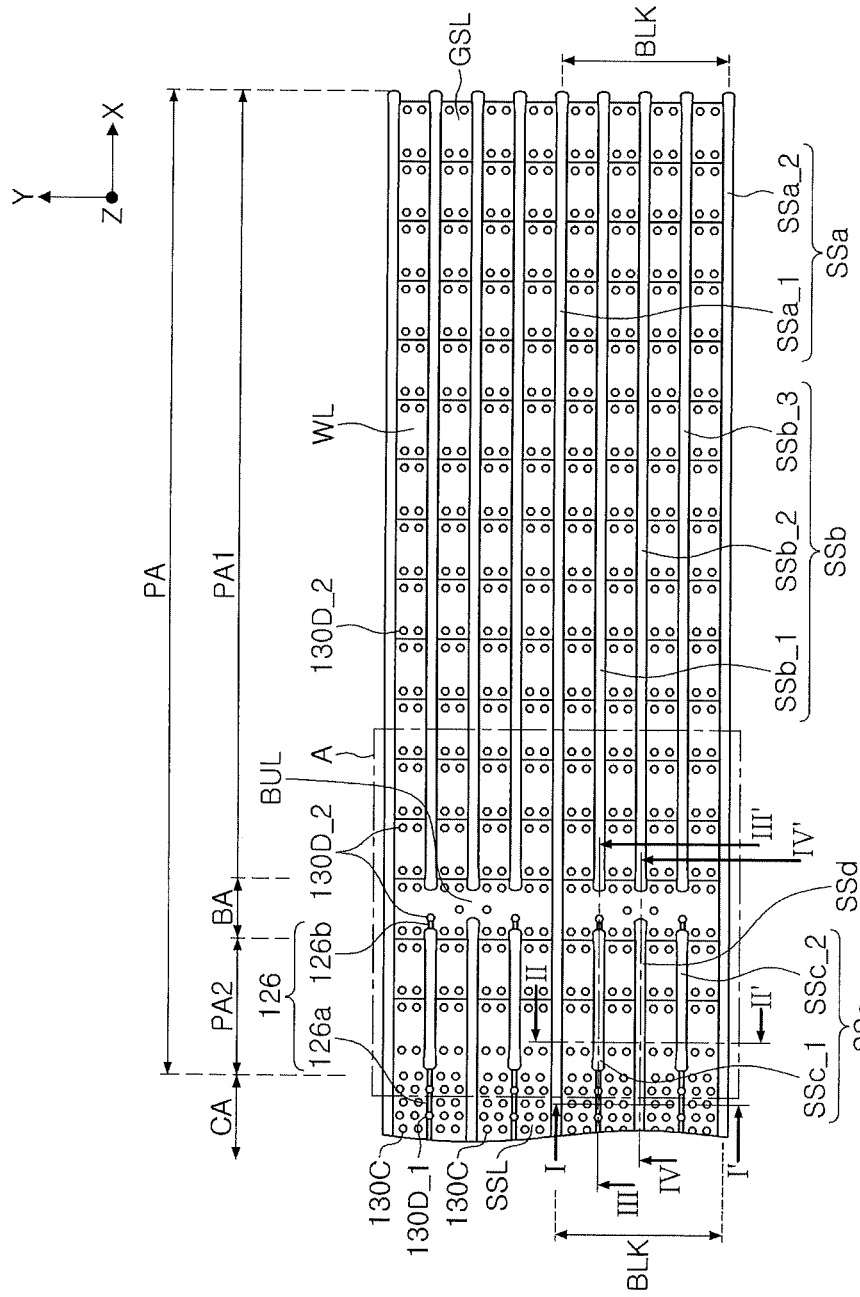
FIG. 3 is a plan view of a portion of a semiconductor device in some embodiments according to the inventive concept.
Figure 4:
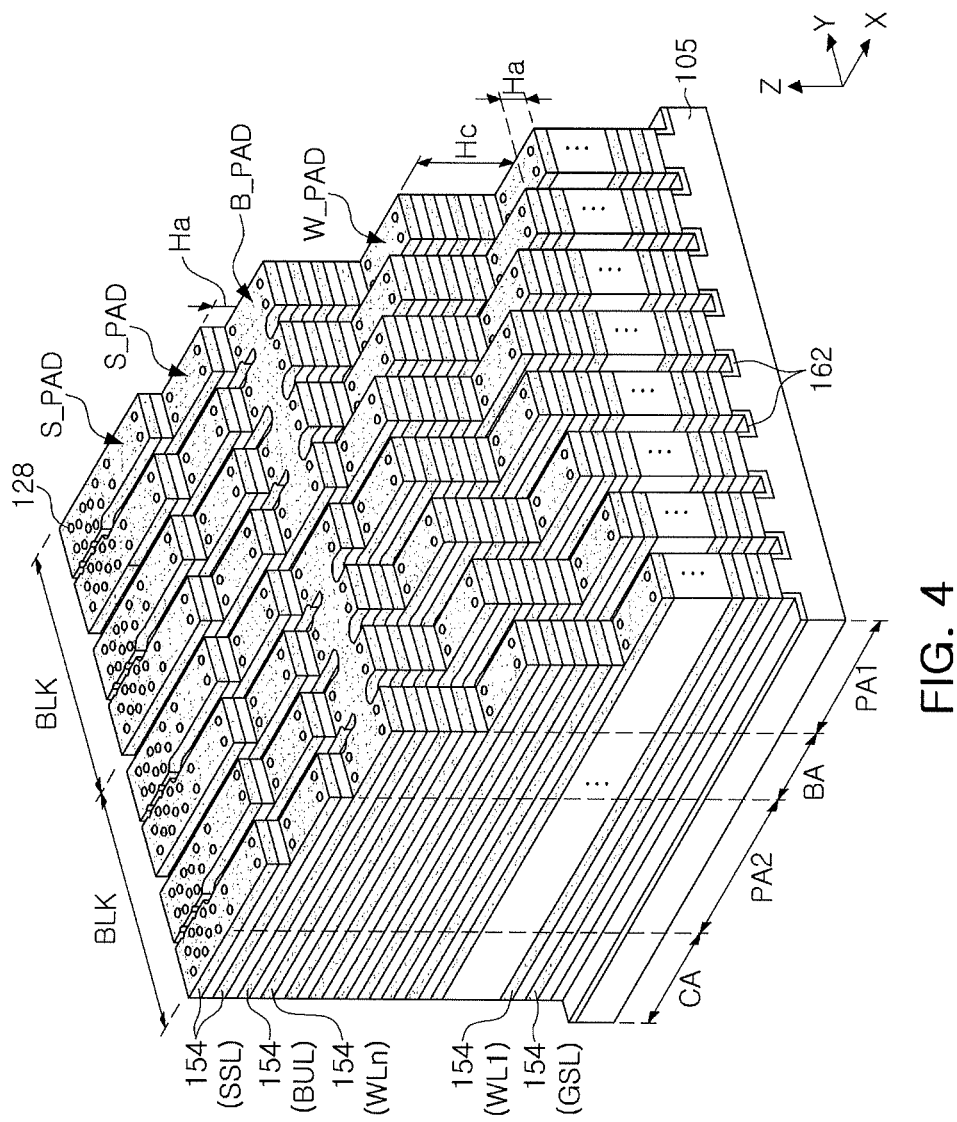
FIG. 4 is a perspective view of region "A" of FIG. 3.
Figure 5A:
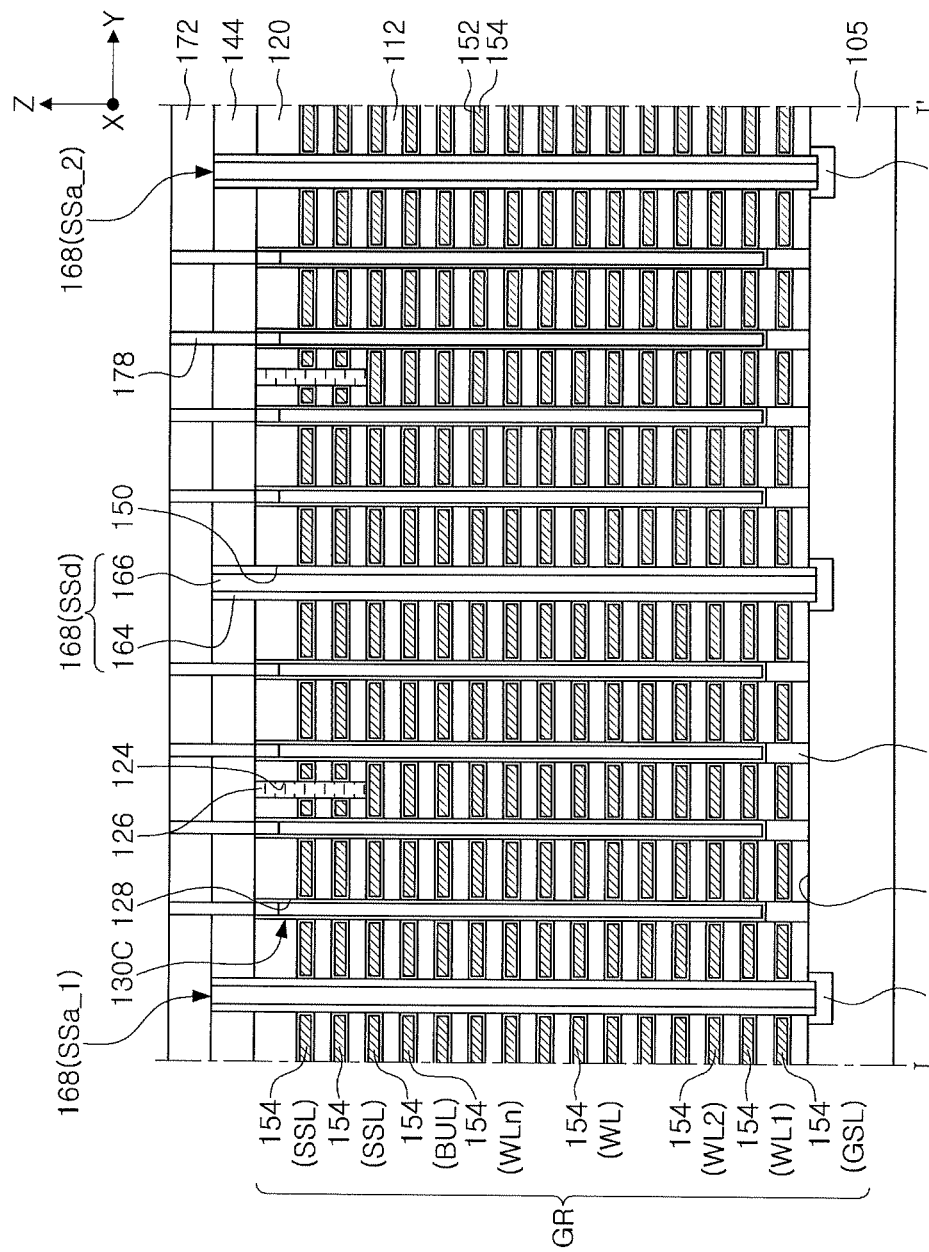
FIG. 5A is a cross-sectional view taken along line I-I' of FIG. 3.
Figure 5B:
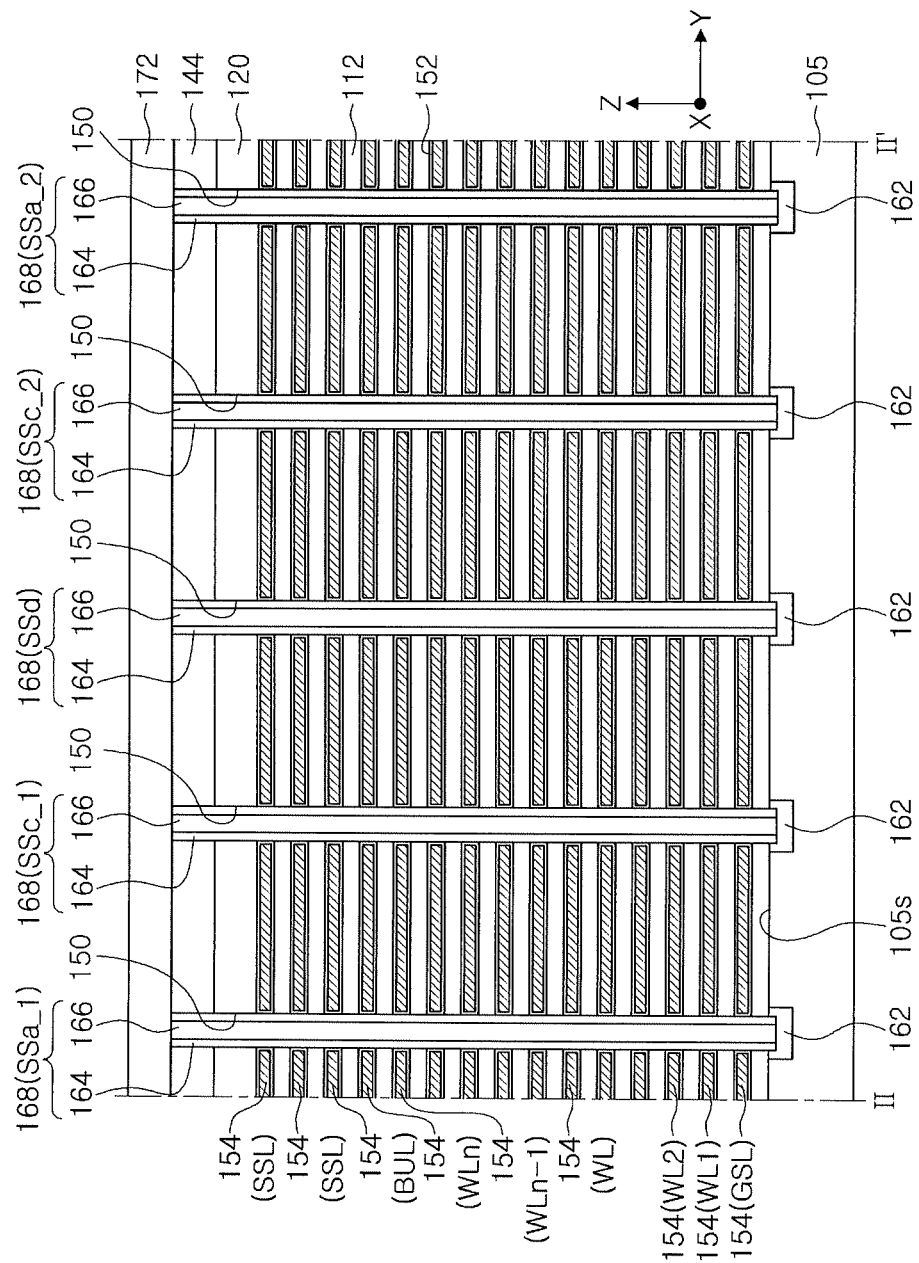
FIG. 5B is a cross-sectional view taken along line II-IP of FIG. 3.
Figure 5C:
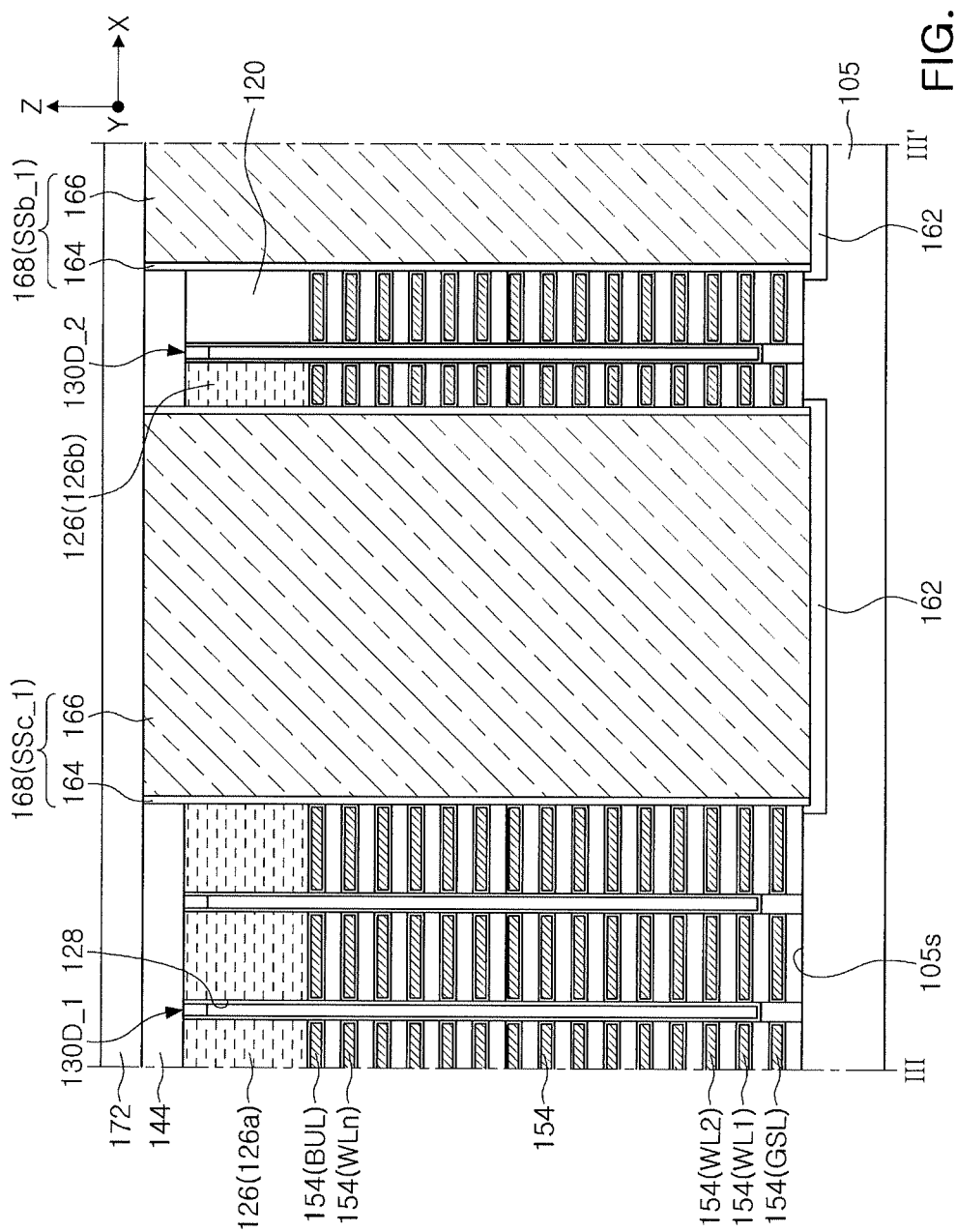
FIG. 5C is a cross-sectional view taken along line of FIG. 3.
Figure 5D:
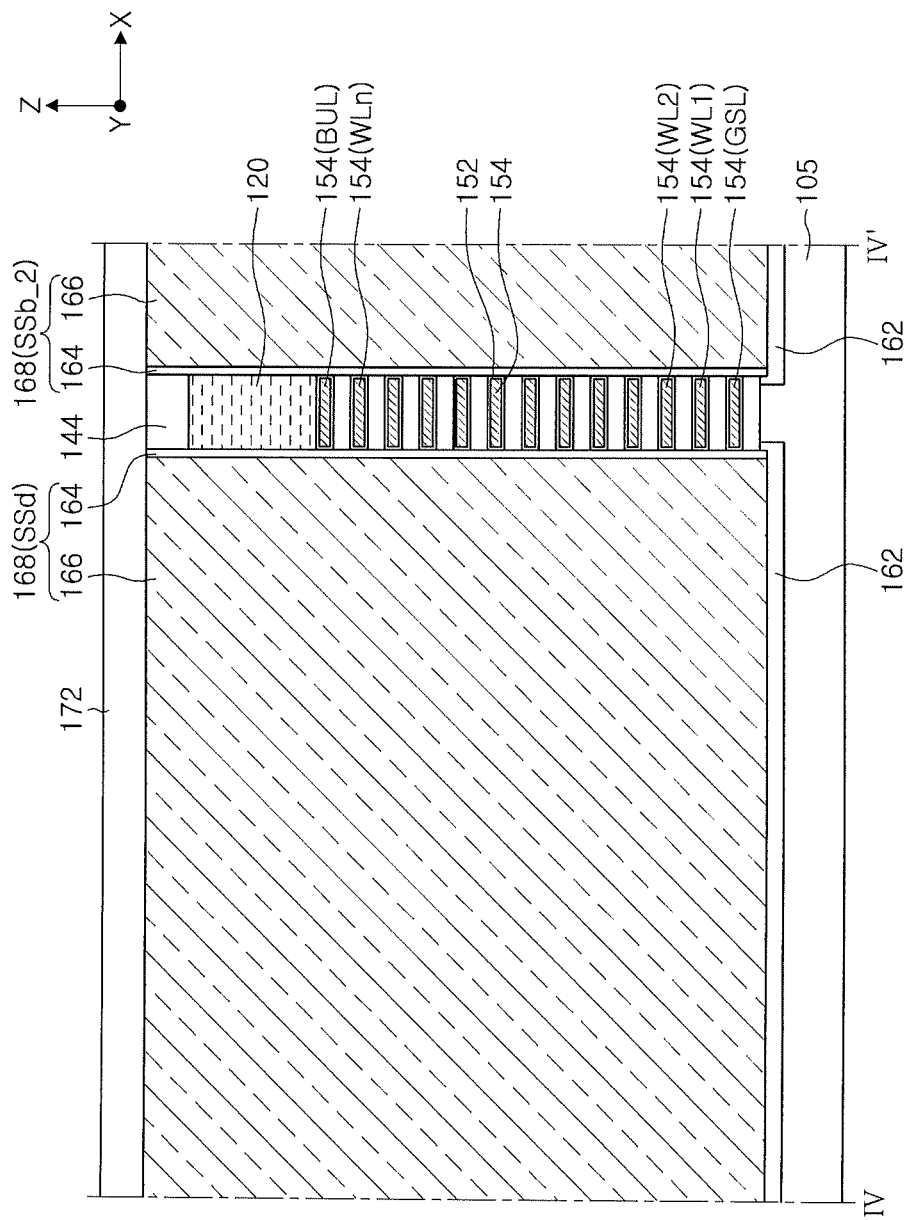
FIG. 5D is a cross-sectional view taken along line IV-IV' of FIG. 3.

First, referring to FIGS. 3, 4, and 5A through 5D, an example of the semiconductor device, according to some example embodiments, will be described. FIG. 3 is a plan view schematically illustrating a portion of components of the semiconductor device, according to an example embodiment. FIG. 4 is a schematic perspective view of region "A" of FIG. 3 to illustrate gate electrodes. FIG. 5A is a cross-sectional view taken along line I-I' of FIG. 3. FIG. 5B is a cross-sectional view taken along line II-IP of FIG. 3. FIG. 5C is a cross-sectional view taken along line III-IIP of FIG. 3. FIG. 5D is a cross-sectional view taken along line IV-IV' of FIG. 3.

Referring to FIGS. 3, 4, 5A through 5D, a semiconductor substrate 105, having a memory cell region CA and a pad region PA adjacent to the memory cell region CA, may be provided. The semiconductor substrate 105 may be a silicon substrate formed of a semiconductor material.

The memory cell region CA may have the memory cell strings S described with reference to FIG. 2 disposed therein. The pad region PA may include a first pad region PA1, a second pad region PA2 nearer to the memory cell region CA than to the first pad region PA1, and a buffer region BA disposed between the first and second pad regions PA1 and PA2.

A gate group GR may be disposed on the semiconductor substrate 105. A plurality of source structures 168 may be disposed on the semiconductor substrate 105, and may pass through the gate group GR in a vertical direction Z upwardly from a surface 105s of the semiconductor substrate 105. The source structures 168 may include a separation source structure SSa disposed in the memory cell region CA and the pad region PA of the semiconductor substrate 105. The separation source structure SSa may include portions parallel to each other. The portions of the separation source structure SSa may pass through (for example, traverse) the gate group GR. The portions of the separation source structure SSa may have substantially the same size and planar shape as each other.

A single gate group GR may be disposed between a first portion SSa_1 and a second portion SSa_2 adjacent to each other among the portions of the separation source structure SSa. Hereinafter, the gate group GR disposed between the first portion SSa_1 and the second portion SSa_2 of the separation source structure SSa will be described primarily.

The gate group GR may include gate electrodes 154 stacked in the vertical direction Z.

The gate electrodes 154 may extend to the pad region PA, while sequentially stacked in the memory cell region CA of the semiconductor substrate 105 in the vertical direction Z. A direction, in which the gate electrodes 154 extend from the memory cell region CA to the pad region PA, may be a first horizontal direction X parallel to the surface 105s of the semiconductor substrate 105.

Among the gate electrodes 154, a plurality of uppermost gate electrodes disposed on the same plane may be a plurality of string select lines SSLs. In an example embodiment, among the gate electrodes 154, secondary gate electrodes disposed on the same plane may also form the string select lines SSLs, together with the uppermost gate electrodes. Among the gate electrodes 154, a lowermost gate electrode may be a ground select line GSL.

Among the gate electrodes 154, a plurality of gate electrodes disposed between the ground select line (GSL) and the string select lines SSLs may be a plurality of word lines WL1 to WLn.

Among the gate electrodes 154, a gate electrode disposed between the uppermost word line WLn and the string select lines SSLs may be a buffer line BUL. As used herein, the "buffer line" may also be referred to as a "dummy line."

Among the word lines WL1 to WLn disposed between the first and second portions SSa_1 and SSa_2 of the separation source structure SSa, word lines WLs disposed on the same plane may be physically or integrally connected to each other in the buffer region BA. For example, between the first and second portions SSa_1 and SSa_2 of the separation source structure SSa, a single word line WL may be disposed on the same plane. Similar to such a configuration, the buffer line BUL may be physically or integrally connected to each other in the buffer region BA. The string select lines SSLs disposed between the first and second portions SSa_1 and SSa_2 of the separation source structure SSa may be spaced apart from each other on the same plane.

The string select lines SSLs may be disposed in the memory cell region CA, and may extend to the second pad region PA2. The string select lines SSLs may include string select line pads S_PADs of FIG. 4 disposed in the second pad region PA2. The string select line pads S_PADs of the string select lines SSLs may not be covered with other gate electrodes.

The buffer line BUL may extend from the memory cell region CA via the second pad region PA2 to the buffer region BA. The buffer line BUL may include a buffer pad B_PAD of FIG. 4 disposed in the buffer region BA. The buffer pad B_PAD may not be covered with the string select line pads S_PADs.

The word lines WL1 to WLn may extend from the memory cell region CA via the second pad region PA2 and the buffer region BA to the first pad region PA1. The word lines WL1 to WLn may include word line pads W_PADs disposed in the first pad region PA1. The word line pads W_PADs may not be covered with other gate electrodes.

In some embodiments, the word line pads W_PADs disposed between the first and second portions SSa_1 and SSa_2 of the separation source structure SSa may be arranged to have a stepped shape. For example, the word line pads W_PADs may have the stepped shape that is higher by a first height Hc in the first horizontal direction X, and by a second height Ha, less than the first height Hc, in a second horizontal direction Y, perpendicular to the first horizontal direction X, while parallel to the surface 105s of the semiconductor substrate 105. In other words, the W_PADs may be stepped in the X direction and in the Y direction as shown in FIG. 4. However, example embodiments of the present inventive concept are not limited thereto. For example, the word line pads W_PADs may also have a stepped shape that is higher by the second height Ha in the first horizontal direction X. A structure described as having a stepped shape may also be referred to as having a "staircase structure."

Interlayer insulating layers 112 may be disposed between the gate electrodes 154 and the semiconductor substrate 105, and between the gate electrodes 154. A first capping insulating layer 120 may be disposed on the gate group GR. The interlayer insulating layers 112 and the first capping insulating layer 120 may be formed of silicon oxides.

An insulating pattern 126 may be disposed on the word lines WL1 to WLn, and may pass through the string select lines SSLs. The insulating pattern 126 may fill a groove 124, passing through the first capping insulating layer 120, the string select lines SSLs, and the interlayer insulating layers 112 adjacent to the string select lines SSLs.

The insulating pattern 126 may separate the string select lines SSLs, disposed on the same plane, in the second horizontal direction Y, perpendicular to the first horizontal direction X, while extending in the first horizontal direction X. Thus, the string select lines SSLs disposed on the same plane may be spaced apart from each other in the second horizontal direction Y, while having a line shape extending in the first horizontal direction X.

A plurality of vertical structures 130C, 130D_1, and 130D_2 may be disposed on the semiconductor substrate 105, and may extend in the vertical direction Z. The vertical structures 130C, 130D_1, and 130D_2 may be disposed within holes 128, passing through the gate group GR. The vertical structures 130C, 130D_1, and 130D_2 may include cell vertical structures 130C, first dummy vertical structures 130D_1, and second dummy vertical structures 130D_2.

The cell vertical structures 130C and the first dummy vertical structures 130D_1 may be disposed in the memory cell region CA of the semiconductor substrate 105, and the second dummy vertical structures 130D_2 may be disposed in the pad region PA of the semiconductor substrate 105.

An arrangement density of the cell vertical structures 130C disposed in the memory cell region CA may be higher than that of the second dummy vertical structures 130D_2 disposed in the pad region PA. Further, the first dummy vertical structures 130D_1 may be disposed in the memory cell region CA, together with the cell vertical structures 130C. Thus, an arrangement density of the cell vertical structures 130C and the first dummy vertical structures 130D_1 disposed in the memory cell region CA may be greater than that of the second dummy vertical structures 130D_2 disposed in the pad region PA. As a result, with regard to the vertical structures 130C, 130D_1, and 130D_2, the arrangement density in the memory cell region CA may be greater than that in the pad region PA.

The cell vertical structures 130C may pass through the string select lines SSLs, the word lines WL1 to WLn, and the ground select line GSL. The first dummy vertical structures 130D_1 may pass through the word lines WL1 to WLn and the ground select line GSL disposed below the insulating pattern 126, while passing through the insulating pattern 126.

A second gate dielectric layer 152 may be disposed on each of upper and lower surfaces of the gate electrodes 154, and may extend between the vertical structures 130C, 130D_1, and 130D_2 and the gate electrodes 154.

Figure 6:
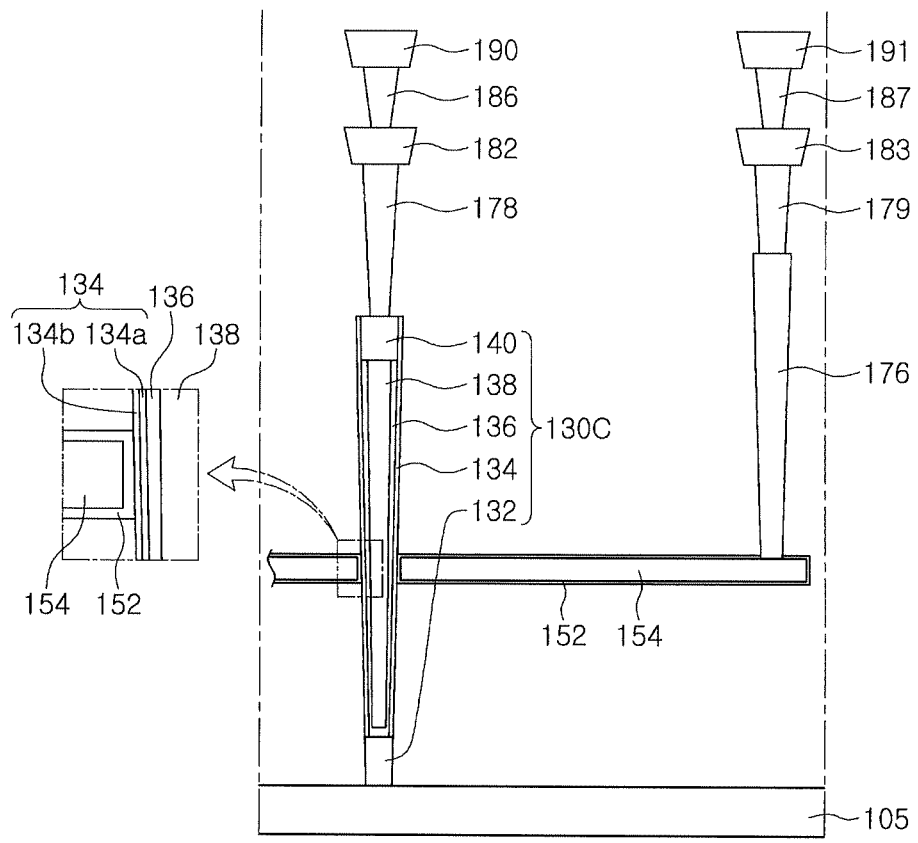
FIG. 6 is a cross-sectional view illustrating components of a semiconductor device in some embodiments according to the inventive concept.

The vertical structures 130C, 130D_1, and 130D_2 may have the same cross-sectional structures. The cross-sectional structure of the vertical structures 130C, 130D_1, and 130D_2 are described below with reference to FIG. 6. Here, FIG. 6 is a cross-sectional view illustrating an interconnection structure, of one (for example, the cell vertical structure 130C) of the vertical structures 130C, 130D_1, and 130D_2, and of one of the word lines WL1 to WLn. FIG. 6 illustrates the cell vertical structure 130C. However, the vertical structures 130C, 130D_1, and 130D_2 may have the same cross-sectional structure, and thus the cross-sectional structure of the cell vertical structure 130C illustrated in FIG. 6 may be understood to be those of the other vertical structures. Further, FIG. 6 may be referenced to describe an interconnection structure of the cell vertical structure 130C and a gate electrode 154 associated therewith.

Referring to FIGS. 3, 4, 5A through 5D, and 6, each of the vertical structures 130C, 130D_1, and 130D_2 may include a semiconductor pattern 132, a first gate dielectric layer 134, a semiconductor layer 136, a core pattern 138, and a pad pattern 140.

The semiconductor pattern 132 may be in contact with the semiconductor substrate 105. In an example embodiment, the semiconductor pattern 132 may have a side surface facing the ground select line GSL. The semiconductor pattern 132 may be disposed at a level lower than those of the word lines WL1 to WLn. The semiconductor pattern 132 may be an epitaxial material layer that may be formed using a selective epitaxial growth (SEG) process. For example, the semiconductor pattern 132 may be formed of monocrystalline silicon.

The core pattern 138 may be disposed on the semiconductor pattern 132, and may be formed of an insulating material (for example, a silicon oxide or the like). The pad pattern 140 may be disposed on the core pattern 138. The pad pattern 140 may be formed of polycrystalline silicon, having n-type conductivity, and may be a drain region. The pad pattern 140 may be disposed at a level higher than those of the string select lines SSLs.

The semiconductor layer 136 may extend in the vertical direction Z, from contact with the semiconductor pattern 132, to cover a side surface of the core pattern 138, and may contact the pad pattern 140. The semiconductor layer 136 may be referred to as a channel layer. The semiconductor layer 136 may a polycrystalline silicon layer.

The first gate dielectric layer 134 may be disposed between the semiconductor layer 136 and the gate group GR, while covering an outer portion of the semiconductor layer 136.

The first gate dielectric layer 134 may include a tunnel dielectric layer 134a and a data storage layer 134b. The tunnel dielectric layer 134a may be interposed between the data storage layer 134b and the semiconductor layer 136.

The tunnel dielectric layer 134a may include a silicon oxide and/or an impurity-doped silicon oxide. The data storage layer 134b may store data in a non-volatile memory device, such as a flash memory device or the like. For example, the data storage layer 134b may be formed of a material, for example, a silicon nitride, that may trap and retain electrons injected from the semiconductor layer 136 through the tunnel dielectric layer 134a, or be purged of the electrons trapped within the data storage layer 134b, depending on operating conditions of a non-volatile memory device, such as a flash memory device or the like. The second gate dielectric layer 152 may be a blocking dielectric layer. The second gate dielectric layer 152 may also include a high-k material, such as AlO or the like.

The data storage layer 134b may store data in regions thereof, facing the word lines WL1 to WLn. The regions that may store data in the data storage layer 134b disposed within one of the cell vertical structures 130C may be arranged in the vertical direction Z.

A second capping insulating layer 144 may be disposed on the first capping insulating layer 120. The second capping insulating layer 144 may be formed of a silicon oxide.

As described above, the source structures 168 may include the separation source structure SSa, having the first and second portions SSa_1 and SSa_2. The source structures 168 may be disposed within trenches 150, and the trenches 150 may expose the semiconductor substrate 105, while passing through the first and second capping insulating layers 120 and 144, the gate electrodes 154 of the gate group GR, and the interlayer insulating layers 112 in the vertical direction Z.

Each of the source structures 168 may include insulating spacers 164 disposed on side walls of each of the trenches 150, and source patterns 166 whose side surfaces are surrounded by the insulating spacers 164. The insulating spacers 164 may be formed of an insulating material, such as a silicon oxide, a silicon nitride, or the like. The source patterns 166 may be formed of a conductive material, including at least one of a metal nitride, such as doped polysilicon, a titanium nitride, or the like, or a metal, such as tungsten or the like.

The source structures 168 may further include a first source structure SSb, a second source structure SSc, and a third source structure SSd disposed between the first and second portions SSa_1 and SSa_2 of the separation source structure SSa. Each of the memory blocks BLKs described with reference to FIG. 1 may be disposed between the adjacent first and second portions SSa_1 and SSa_2 of the separation source structure SSa.

The first source structure SSb may be disposed in the first pad region PA1 of the pad region PA. The first source structure SSb may include a plurality of portions spaced apart from each other while substantially parallel to each other. For example, the first source structure SSb may include a first portion SSb_1, a second portion SSb_2, and a third portion SSb_3. The first to third portions SSb_1 to SSb_3 of the first source structure SSb may each have the same size and planar shape as each other.

The second portion SSb_2 of the first source structure SSb may be disposed between the first and third portions SSb_1 and SSb_3. The first portion SSb_1 of the first source structure SSb may be close to the first portion SSa_1 of the separation source structure SSa, and the third portion SSb_3 of the first source structure SSb may be close to the second portion SSa_2 of the separation source structure SSa.

The second source structure SSc may be disposed in the second pad region PA2 of the pad region PA. The second source structure SSc may include a first portion SSc_1 disposed between the memory cell region CA and the first portion SSb_1 of the first source structure SSb, and a second portion SSc_2 disposed between the memory cell region CA and the third portion SSb_3 of the first source structure SSb.

The third source structure SSd may be disposed in the memory cell region CA of the semiconductor substrate 105, and may extend to the second pad region PA2 of the pad region PA of the semiconductor substrate 105. The third source structure SSd may have an end portion, opposing an end portion of the second portion SSb_2 of the first source structure SSb.

Impurity regions 162 may be disposed within the semiconductor substrate 105, and may be electrically connected to the source patterns 166. The impurity regions 162 may have n-type conductivity, and the semiconductor substrate 105 adjacent to the impurity regions 162 may have p-type conductivity. The impurity regions 162 may be the common source line CSL described with reference to FIGS. 1 and 2.

A third capping insulating layer 172 may be disposed on the second capping insulating layer 144, and may cover the source structures 168. The third capping insulating layer 172 may be formed of a silicon oxide.

A first interconnection structure may be disposed on the cell vertical structures 130C, and a second interconnection structure may be disposed on gate electrode pads of the gate electrodes 154. The gate electrode pads of the gate electrodes 154 may be disposed in the pad region PA. An example of the first interconnection structure and the second interconnection structure will be described with reference to FIG. 6.

First interconnection structures 178, 182, 186, and 190 of FIG. 6, having a multilayer structure, may be disposed on the respective cell vertical structures 130C. A lower contact plug 178 of the first interconnection structures 178, 182, 186, and 190 may be electrically connected to each of the cell vertical structures 130C and an upper wiring 190 of the first interconnection structures 178, 182, 186, and 190 may be a bit line BL of FIG. 1 that may be electrically connected to the page buffer 4 described with reference to FIG. 1.

Second interconnection structures, having a multilayer structure, may be disposed on the gate electrode pads of the gate electrodes 154, that is, the string select lines SSLs, the word lines WL1 to WLn, or the ground select line GSL. For example, as illustrated in FIG. 6, one of the second interconnection structures 176, 179, 183, 187, and 191 of FIG. 2 may be disposed on each of the gate electrode pads of the gate electrodes 154 used as one of the string select lines SSLs, the word lines WL1 to WLn, and the ground select line GSL (see FIG. 2). For example, a lower contact plug 176 of the second interconnection structures 176, 179, 183, 187, and 191 may be electrically connected to the gate electrode pad of the gate electrode 154, while in contact with the gate electrode pad, and an upper wiring 191 may electrically connect the gate electrode 154 to the row decoder 3 described with reference to FIG. 1.

End portions of each of the source structures 168 may have a rounded shape. A portion of the source structures 168, including the separation source structure SSa, the first source structure SSb, the second source structure SSc, and the third source structure SSd, may have end portions opposing each other. Among the source structures 168, the end portions may be spaced apart from each other, while opposing each other, in the buffer region BA in which the buffer pad B_PAD of the buffer line BUL of FIG. 4 may be disposed.

Among the source structures 168, the first portion SSb_1 of the first source structure SSb and the first portion SSc_1 of the second source structure SSc may have end portions, opposing each other. Further, the second portion SSb_2 of the first source structure SSb and the third source structure SSd may have end portions, opposing each other, and the third portion SSb_3 of the first source structure SSb and the second portion SSc_2 of the second source structure SSc may have end portions, opposing each other.

Figure 7:
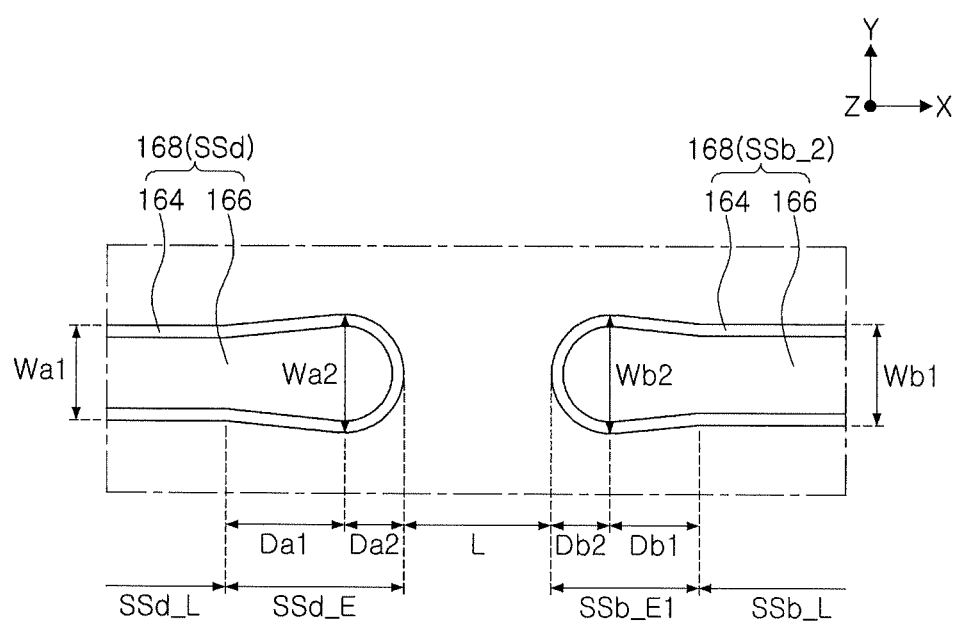
FIG. 7 is a plan view illustrating components of a semiconductor device in some embodiments according to the inventive concept.

An example of the source structures, having the end portions opposing each other, is described with reference to FIG. 7. FIG. 7 is a plan view illustrating a planar shape of the end portions of the second portion SSb_2 of the first source structure SSb and the third source structure SSd.

Referring to FIGS. 3 and 7, the second portion SSb_2 of the first source structure SSb and the third source structure SSd may have a first end portion SSb_E1 and an end portion SSd_E, opposing each other.

The second portion SSb_2 of the first source structure SSb may have a line portion SSb_L, extending in the first horizontal direction X, and the first end portion SSb_E1, extending in a direction toward the third source structure SSd from the line portion SSb_L. The first end portion SSb_E1 of the second portion SSb_2 of the first source structure SSb may be integrally connected to the line portion SSb_L thereof.

The third source structure SSd may have a line portion SSd_L, extending in the first horizontal direction X, and the end portion SSd_E, extending in a direction toward the second portion SSb_2 of the first source structure SSb from the line portion SSb_L. The end portion SSd_E of the third source structure SSd may be integrally connected to the line portion SSd_L thereof.

The first end portion SSb_E1 of the second portion SSb_2 of the first source structure SSb may include a first region Db1, extending in a direction toward the third source structure SSd from the line portion SSb_L while having a width that increased in the direction, and a second region Db2, having a width decreased in the direction from the first region Db1.

The first end portion SSb_E1 of the second portion SSb_2 of the first source structure SSb may have a significantly increased width Wb2 between the first region Db1 and the second region Db2, and the significantly increased width Wb2 may be greater than a width Wb1 of the line portion SSb_L. The width Wb2 can be the maximum width of the second portion SSb_2.

In some embodiments, the term "length" may refer to a length in the first horizontal direction X, and the term "width" may refer to a width in the second horizontal direction Y.

The end portion SSd_E of the third source structure SSd may include a first region Da1, extending in a direction toward the second portion SSb_2 of the first source structure SSb from the line portion SSd_L while having a width increased in the direction, and a second region Da2, having a width decreased in the direction from the first region Da1.

Still further according to FIG. 7, the first region Db1 and the first region Da1 can each be referred to as a respective flared region that has a width that gradually increases. Further, the second region Da2 and the second region Db2 can each be referred to as a respective end face region that has a width that gradually decreases. Moreover, the width of each of the flared regions gradually increases when approaching the respective end face region. Still further, the width of the end face regions gradually decreases when moving away from the respective flared region. Still further, the width of the flared region may increase toward the point of the maximum width Wb2/Wa2 and the width of the end face region can also increase toward the point of the maximum width Wb2/Wa2.

The end portion SSd_E of the third source structure SSd may have a significantly increased width Wa2 between the first region Da1 and the second region Da2, and the significantly increased width Wa2 may be greater than a width Wa1 of the line portion SSd_L.

The second regions Da2 and Db2 of the end portions SSb_E1 and SSd_E of the second portion SSb_2 of the first source structure SSb and the third source structure SSd may have lengths less than those of the first regions Da1 and Db1.

In some embodiments, a length of the first region Db1 of the first end portion SSb_E1 of the second portion SSb_2 of the first source structure SSb may be less than that of the first region Da1 of the end portion SSd_E of the third source structure SSd.

In some embodiments, the significantly increased width Wb2 may be substantially the same as the significantly increased width Wa2.

In some embodiments, a distance L between the first end portion SSb_E1 of the second portion SSb_2 of the first source structure SSb and the end portion SSd_E of the third source structure SSd may be greater than the significantly increased widths Wb2 and Wa2.

In some embodiments, the width Wb1 may be greater than the width Wa1.

As described with respect to FIGS. 3 and 7, a planar shape of each of the second portion SSb_2 of the first source structure SSb and the third source structure SSd, having the end portions SSb_E1 and SSd_E opposing each other, may be substantially the same as a planar shape of each of the third portion SSb_3 of the first source structure SSb and the second portion SSc_2 of the second source structure SSc, having end portions opposing each other, and a planar shape of each of the first portion SSb_1 of the first source structure SSb and the first portion SSc_1 of the second source structure SSc, having end portions opposing each other.

Figure 8A:
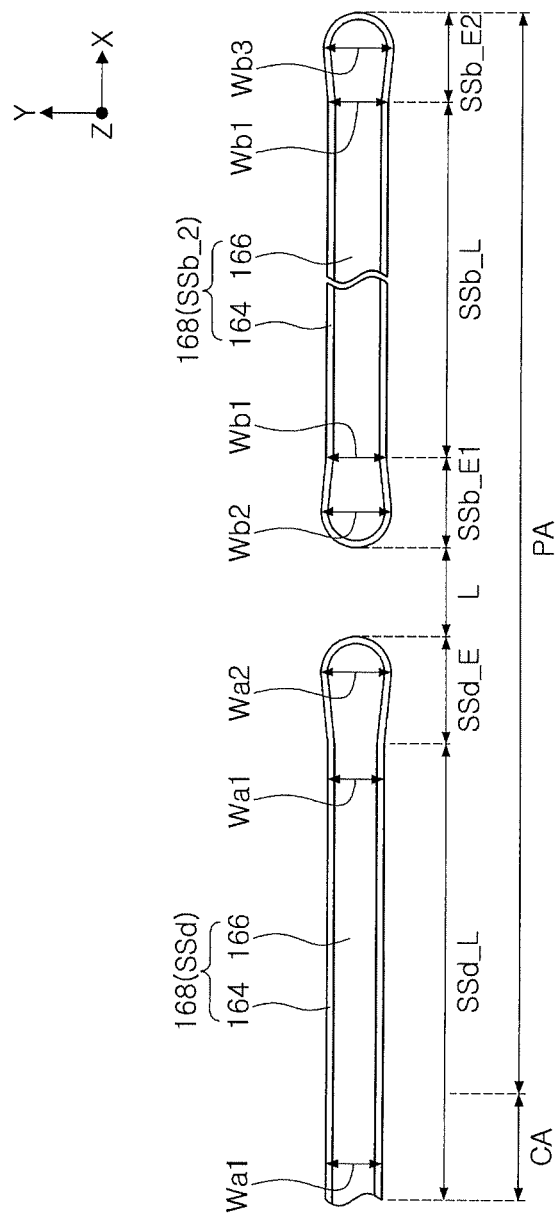
FIGS. 8A through 8C are plan views illustrating components of a semiconductor device in some embodiments according to the inventive concept.

Referring to FIGS. 3, 7, and 8A, as described with reference to FIG. 7, the second portion SSb_2 of the first source structure SSb and the third source structure SSd may have the end portions SSb_E1 and SSd_E.

The line portion SSd_L of the third source structure SSd may extend from the memory cell region CA to the pad region PA, and may have substantially the same width Wa1.

In the second portion SSb_2 of the first source structure SSb, an end portion opposite the first end portion SSb_E1 opposing the third source structure SSd may be defined as a second end portion SSb_E2. Thus, the second portion SSb_2 of the first source structure SSb may include the first and second end portions SSb_E1 and SSb_E2, and the line portion SSb_L between the first and second end portions SSb_E1 and SSb_E2.

In some embodiments, the second end portion SSb_E2 of the second portion SSb_2 of the first source structure SSb may have a mirror-symmetric structure with respect to the first end portion SSb_E1 with the line portion SSb_L interposed between the first and second end portions SSb_E1 and SSb_E2. Thus, the second end portion SSb_E2 of the second portion SSb_2 of the first source structure SSb may have a significantly increased width Wb3 corresponding to the significantly increased width Wb2.

Figure 8B:
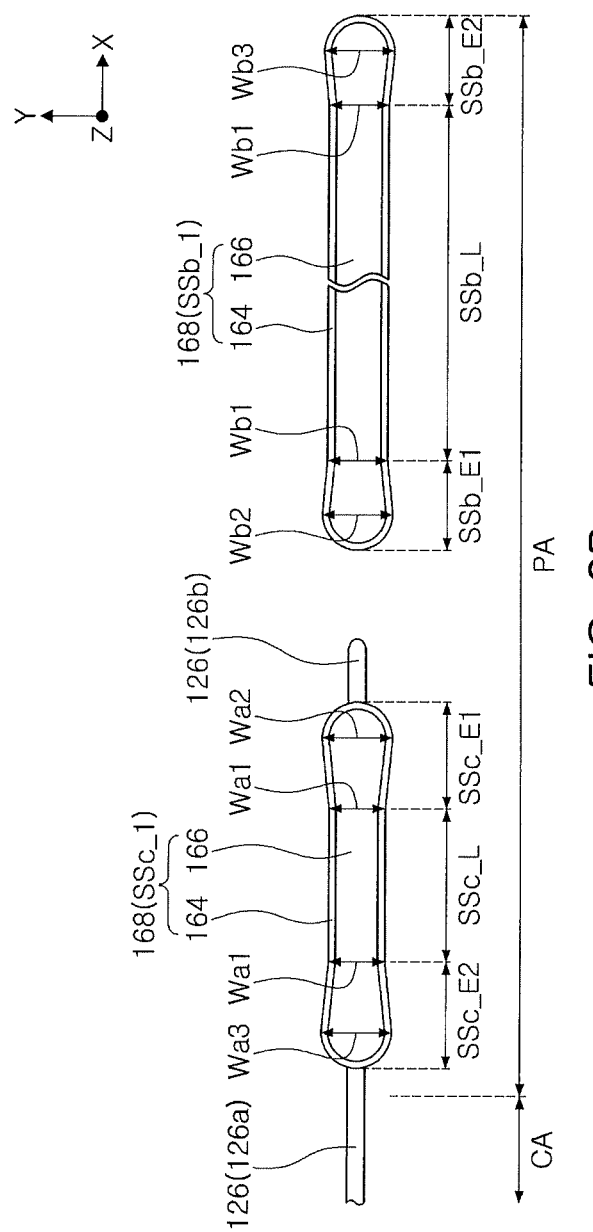

Referring to FIGS. 3, 8A, and 8B, the first portion SSb_1 of the first source structure SSb may have substantially the same planar shape and size as the second portion SSb_2 thereof.

The first portion SSc_1 of the second source structure SSc may not overlap the memory cell region CA, and may be disposed in the pad region PA. The first portion SSc_1 of the second source structure SSc may include a line portion SSc_L and a first end portion SSc_E1 and a second end portion SSc_E2 disposed at opposing ends of the line portion SSc_L. The first end portion SSc_E1 of the first portion SSc_1 of the second source structure SSc may oppose the first end portion SSb_E1 of the first portion SSb_1 of the first source structure SSb, and the second end portion SSc_E2 may be disposed opposite the first end portion SSc_E1.

In some embodiments, the first end portion SSc_E1 of the first portion SSc_1 of the second source structure SSc may have substantially the same planar shape and size as the end portion SSd_E of the third source structure SSd, and the second end portion SSc_E2 may have a mirror-symmetric structure with respect to the first end portion SSc_E1. Thus, a significantly increased width Wa3 of the second end portion SSc_E2 of the first portion SSc_1 of the second source structure SSc may be substantially the same as the significantly increased width Wa2 of the first end portion SSc_E1.

The first portion SSc_1 of the second source structure SSc may separate a first portion 126a of the insulating pattern 126 from a second portion 126b thereof, while in contact with the first and second portions 126a and 126b.

In some embodiments, a length of the line portion SSc_L of the first portion SSc_1 of the second source structure SSc may be less than that of the line portion SSb_L of the first portion SSb_1 of the first source structure SSb.

In some embodiments, the second portion SSc_2 of the second source structure SSc may have substantially the same planar shape and size as the first portion SSc_1 thereof.

In some embodiments, a length of the second source structure SSc may be less than that of the first source structure SSb.

Figure 8C:
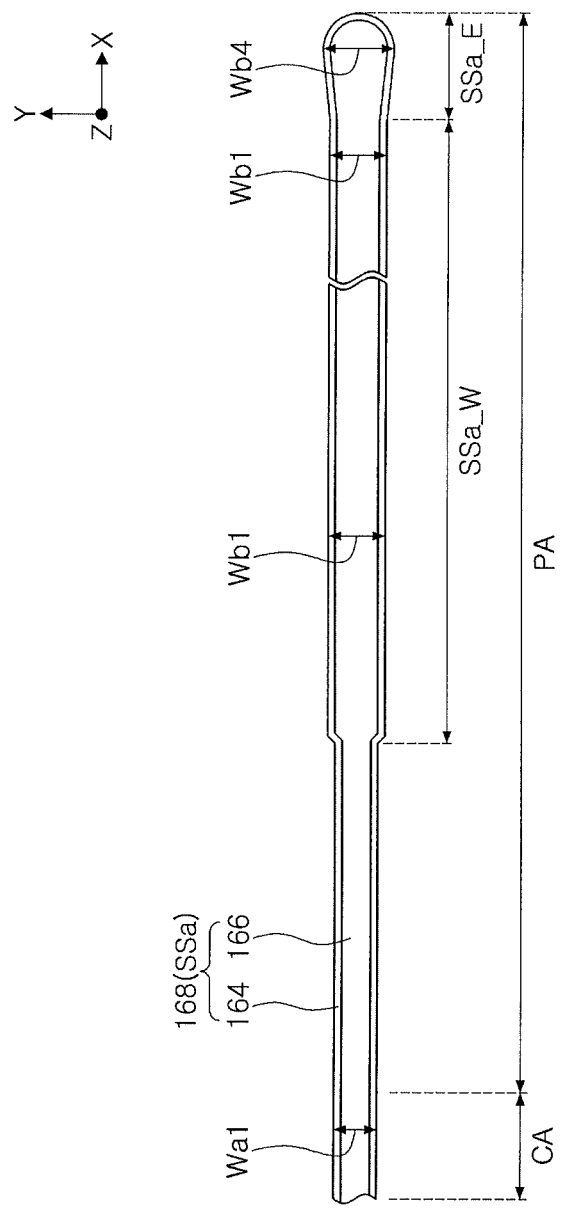

Referring to FIGS. 8A through 8C, the separation source structure SSa may include a line portion SSa_L, an extension portion SSa_W, and an end portion SSa_E. The line portion SSa_L of the separation source structure SSa may be disposed in the memory cell region CA, and may extend into a region of the pad region PA. The extension portion SSa_W of the separation source structure SSa may extend from the line portion SSa_L in the first horizontal direction X, and may have a width Wb1 greater than a Wa1 of the line portion SSa_L. The end portion SSa_E of the separation source structure SSa may have substantially the same planar shape and size as the second end portion SSb_E2 of the second portion SSb_2 of the first source structure SSb. A significantly increased width Wb4 of the end portion SSa_E of the separation source structure SSa may be substantially the same as the significantly increased width Wa3 of the second end portion SSb_E2 of the second portion SSb_2 of the first source structure SSb.

Figure 9A:
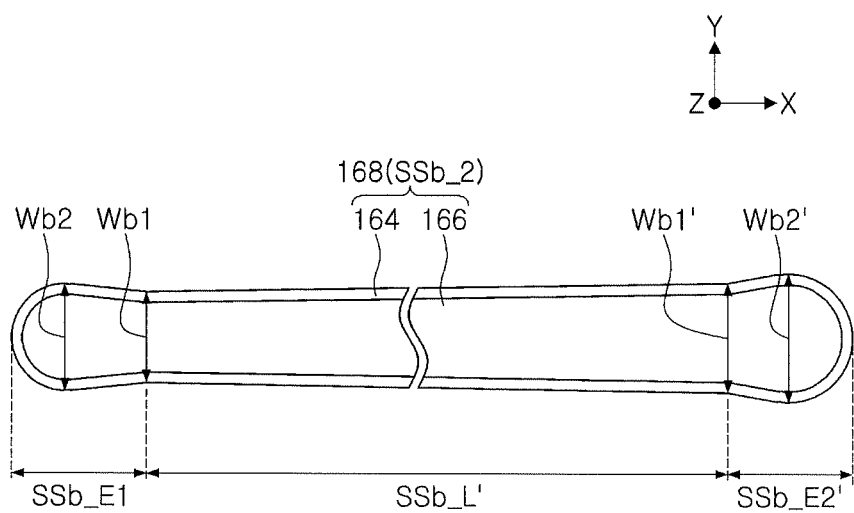
FIGS. 9A and 9B are plan views illustrating components of a semiconductor device in some embodiments according to the inventive concept.
Figure 9B:
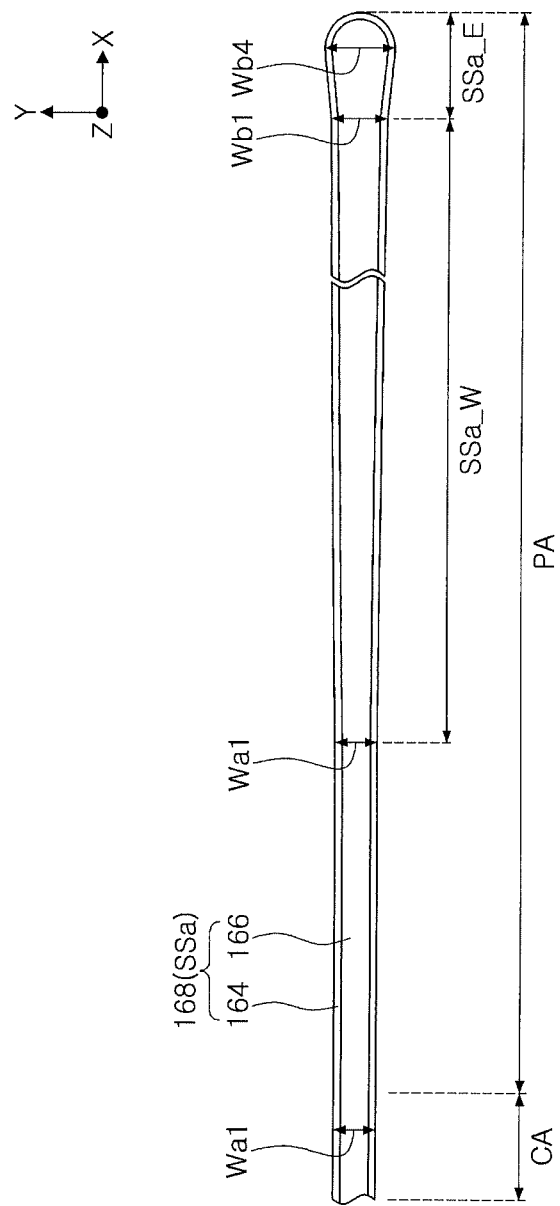

In some embodiments, the line portion SSb_L of the second portion SSb_2 of the first source structure SSb may have substantially the same width Wb1. However, example embodiments of the present inventive concept are not limited thereto. For example, the line portion SSb_L of the second portion SSb_2 of the first source structure SSb described with reference to FIG. 8A may be a line portion SSb_L' whose width increases toward the second end portion SSb_E2 from the first end portion SSb_E1, as illustrated in FIG. 9A. For example, the line portion SSb_L' of the second portion SSb_2 of the first source structure SSb may have a first width Wb1 in a portion of the line portion SSb_L' adjacent to the first end portion SSb_E1, and may have a second width Wb1' greater than the first width Wb1 in a portion of the line portion SSb_L', adjacent to the second end portion SSb_E2.

In some embodiments, the second end portion SSb_E2 of the second portion SSb_2 of the first source structure SSb may have a significantly increased width Wb2' greater than the significantly increased width Wb2 of the first end portion SSb_E1.

In some embodiments, the extension portion SSa_W of the separation source structure SSa illustrated in FIG. 8C may have substantially the same width Wb1. However, example embodiments of the present inventive concept are not limited thereto. For example, the extension portion SSa_W of the separation source structure SSa illustrated in FIG. 8C may be an extension portion SSa_W' of FIG. 9B whose width increases. The extension portion SSa_W' of the separation source structure SSa illustrated in FIG. 9B may have the same first width Wa1 as the line portion SSa_L in a portion of the extension portion SSa_W', adjacent to the line portion SSa_L, and may have a second width Wb1 greater than the first width Wa1 in a portion of the extension portion SSa_W', adjacent to the end portion SSa_E.

Figure 10A:
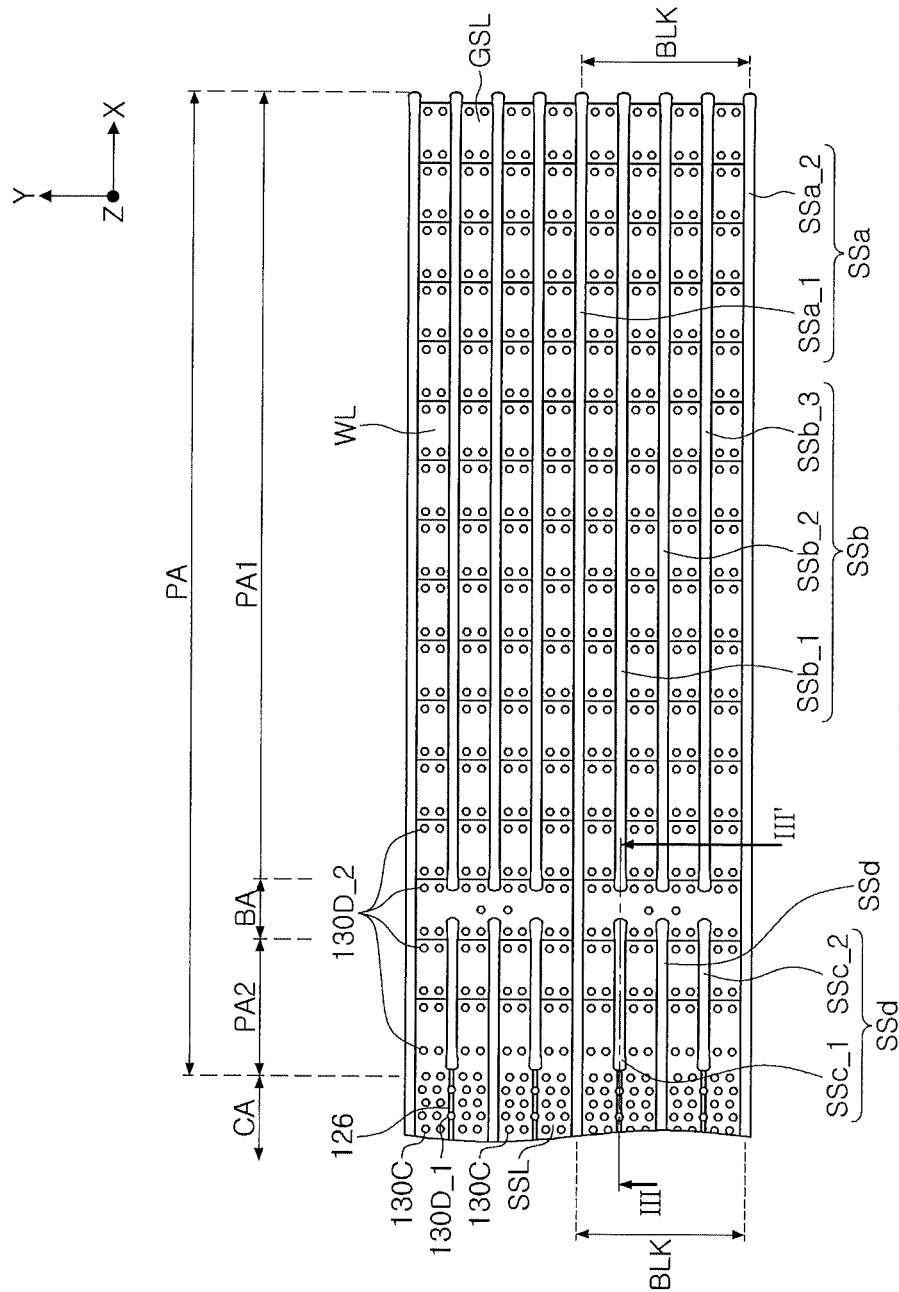
FIG. 10A is a plan view of a semiconductor device, according to a modified example embodiment.
Figure 10B:
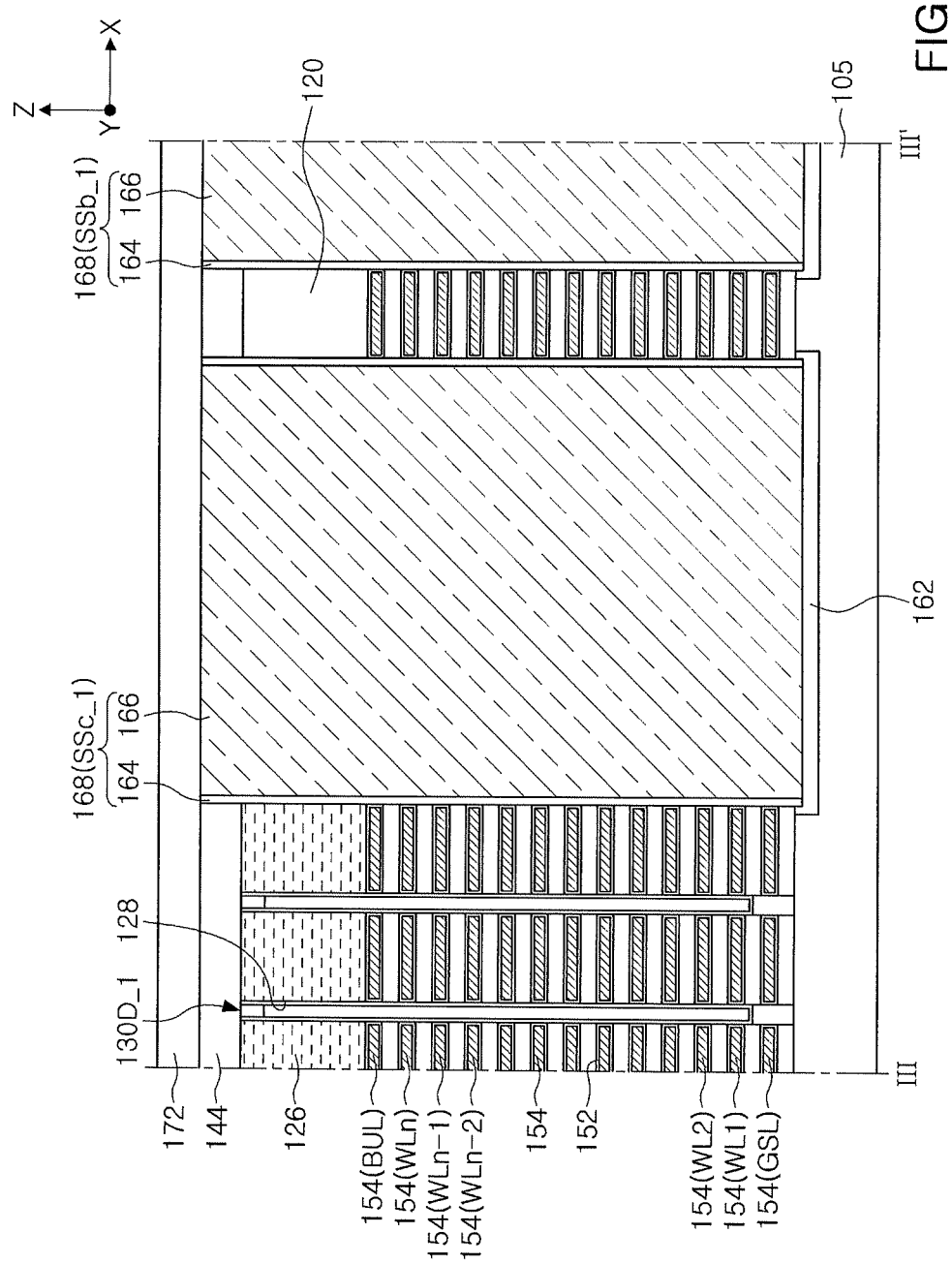
FIG. 10B is a cross-sectional view taken along line of FIG. 10A.

As illustrated in FIGS. 3, 5C, and 8B, the second source structure SSc may be disposed between the first portion 126a and the second portion 126b of the insulating pattern 126. However, example embodiments of the present inventive concept are not limited thereto. A modified example of the second source structure SSc is described with reference to FIGS. 10A and 10B. FIG. 10A is a plan view of the modified example of the second source structure SSc described with reference to FIG. 3, and may correspond to the plan view of FIG. 3. FIG. 10B is a cross-sectional view taken along line of FIG. 10A that may correspond to FIG. 3.

Referring to FIGS. 10A and 10B, a modified second source structure SSc' may extend to a position corresponding to the second portion 126b of the insulating pattern 126 described with reference to FIGS. 3, 5C, and 8B. Thus, a distance between first and second portions SSc_1 and SSc_2 of the modified second source structure SSc' and the first and third portions SSb_1 and SSb_3 of the first source structure SSb may be the same as a distance between the third source structure SSd and the second portion SSb_2 of the first source structure SSb.

Figure 11:
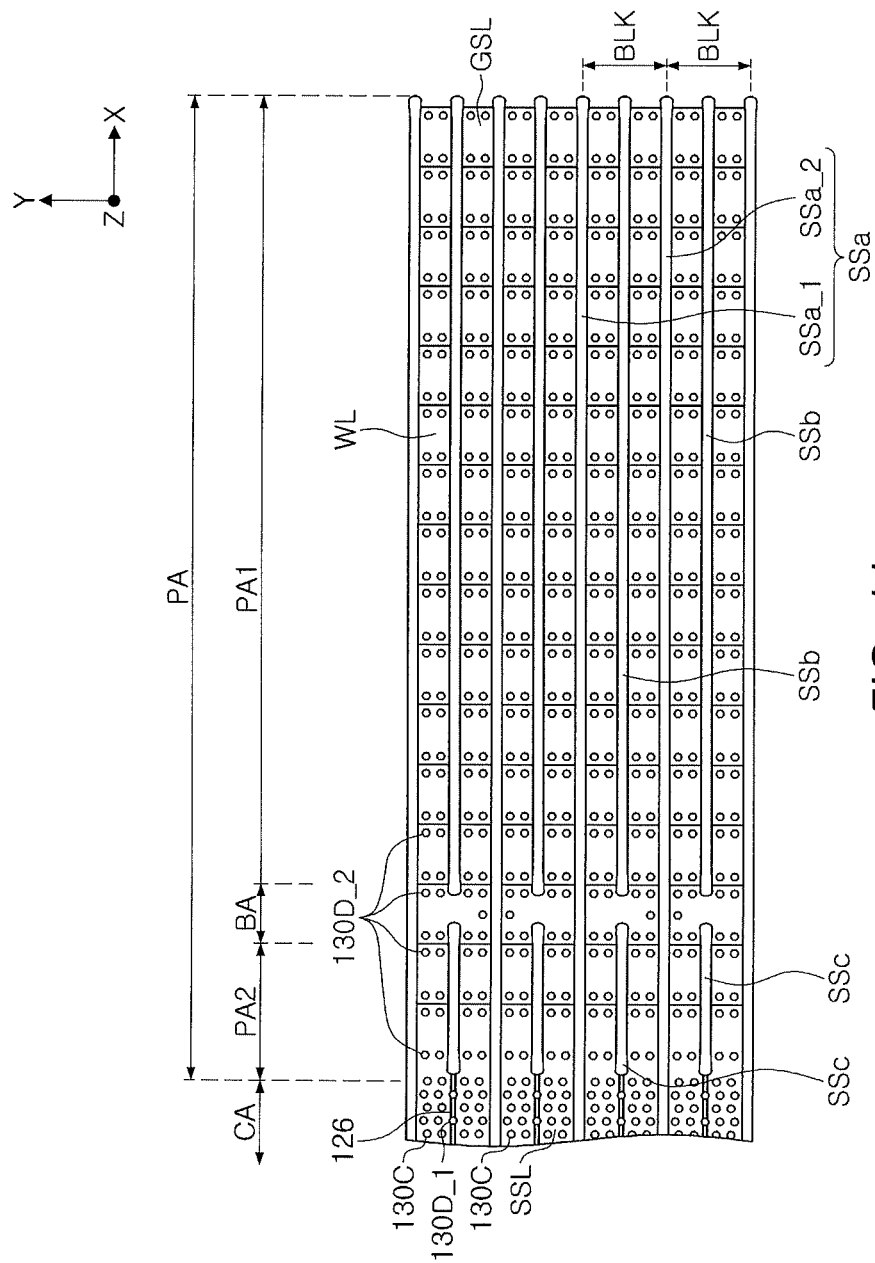
FIG. 11 is a plan view of a semiconductor device in some embodiments according to the inventive concept.

As described about with reference to FIGS. 3 through 10A and 10B, the second portion SSb_2 of the first source structure SSb and the third source structure SSd may have end portions, opposing each other while spaced apart from each other. However, example embodiments of the present inventive concept are not limited thereto. For example, the second portion SSb_2 of the first source structure SSb and the third source structure SSd may be integrally connected to each other without having end portions, opposing each other, and may be provided as a portion of the separation source structure SSa. Thus, as illustrated in FIG. 11, the first source structure SSb and the second source structure SSc, having end portions opposing each other, may be disposed between the first and second portions SSa_1 and SSa_2 of the separation source structure SSa, parallel to each other while spaced apart from each other. The first source structure SSb and the second source structure SSc of FIG. 11 may correspond to the first portion SSb_1 of the first source structure SSb of FIG. 3 and the second portion SSc_2 of the second source structure SSc of FIG. 3, respectively.

Next, an example of a method of forming the semiconductor device described above will be described with reference to FIGS. 12A, 12B, 13A, 13B, 14A, 14B, 15A, and 15B. FIGS. 12A, 13A, 14A, and 15A are cross-sectional views taken along line I-I' of FIG. 3, and FIGS. 12B, 13B, 14B, and 15B are cross-sectional views taken along line of FIG. 3.

Figure 12A:
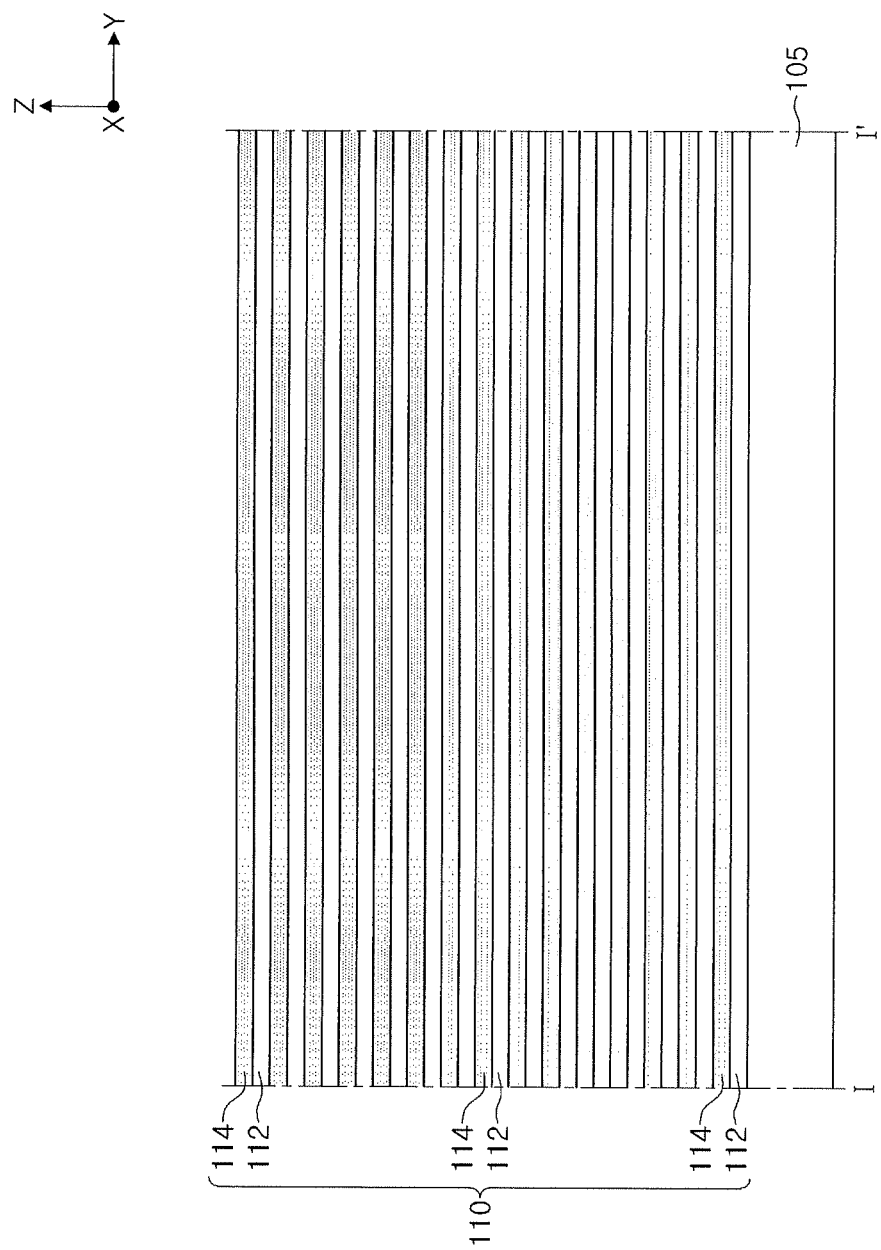
FIGS. 12A, 12B, 13A, 13B, 14A, 14B, 15A, and 15B are cross-sectional views illustrating a method of forming a semiconductor device in some embodiments according to the inventive concept.
Figure 12B:
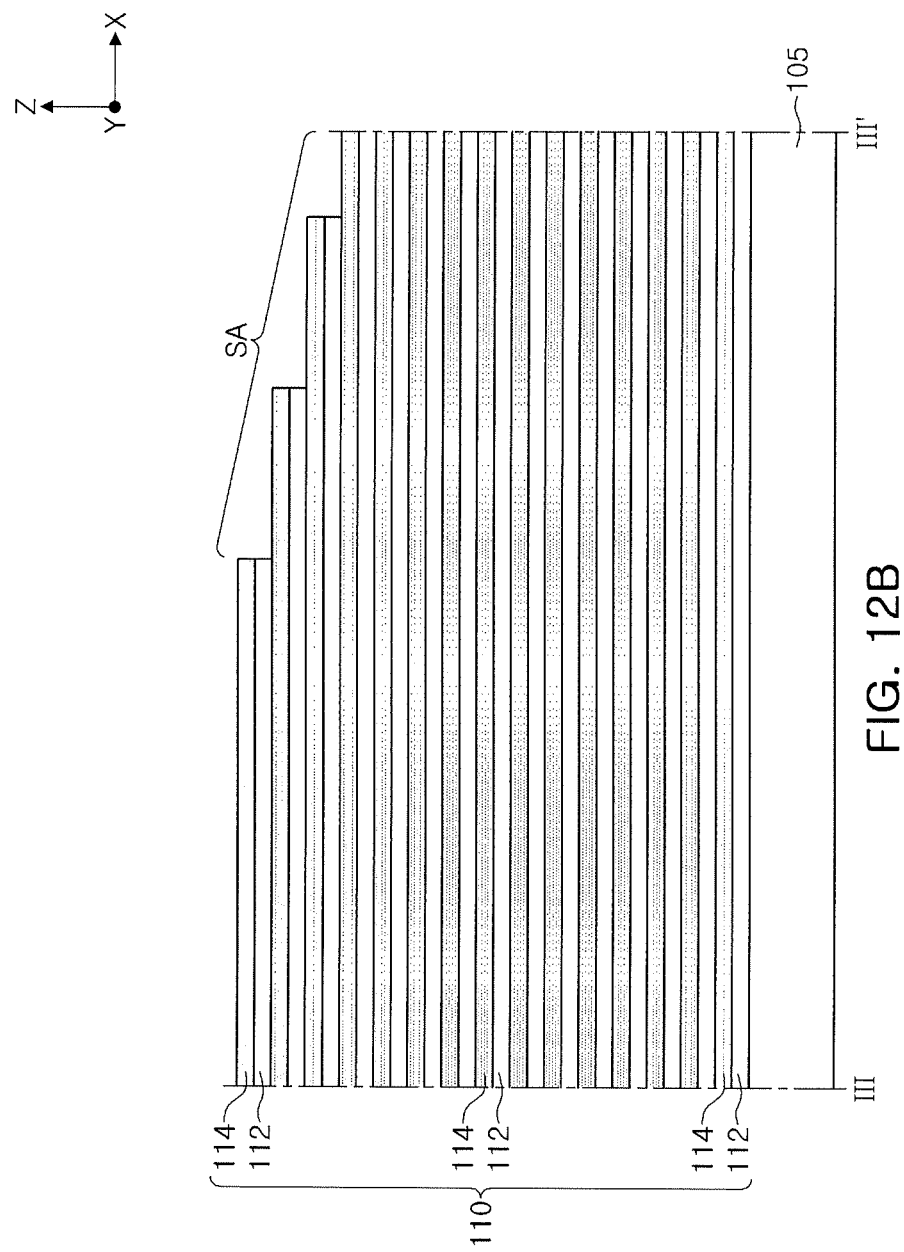

Referring to FIGS. 3, 12A, and 12B, a molded structure 110 may be formed to include interlayer insulating layers 112 and sacrificial layers 114 alternately and repeatedly stacked on a surface 105s of a semiconductor substrate 105, having a memory cell region CA and a pad region PA. The interlayer insulating layers 112 may be formed of a silicon oxide, and the sacrificial layers 114 may be formed of a silicon nitride.

A step area SA may be formed in the pad region PA of the semiconductor substrate 105 by patterning the molded structure 110. The step area SA may be formed using a patterning process using a photolithography process. The step area SA may be formed to have various structures. For example, the step area SA may have a structure, lower by a predetermined depth in a first horizontal direction X, parallel to the surface 105s of the semiconductor substrate 105, and lower by a predetermined depth in a second horizontal direction Y, perpendicular to the first horizontal direction X and lower by a depth greater than the predetermined depth in the first horizontal direction X, in the area of the word line pads W_PADS described with reference to FIG. 4.

Figure 13A:
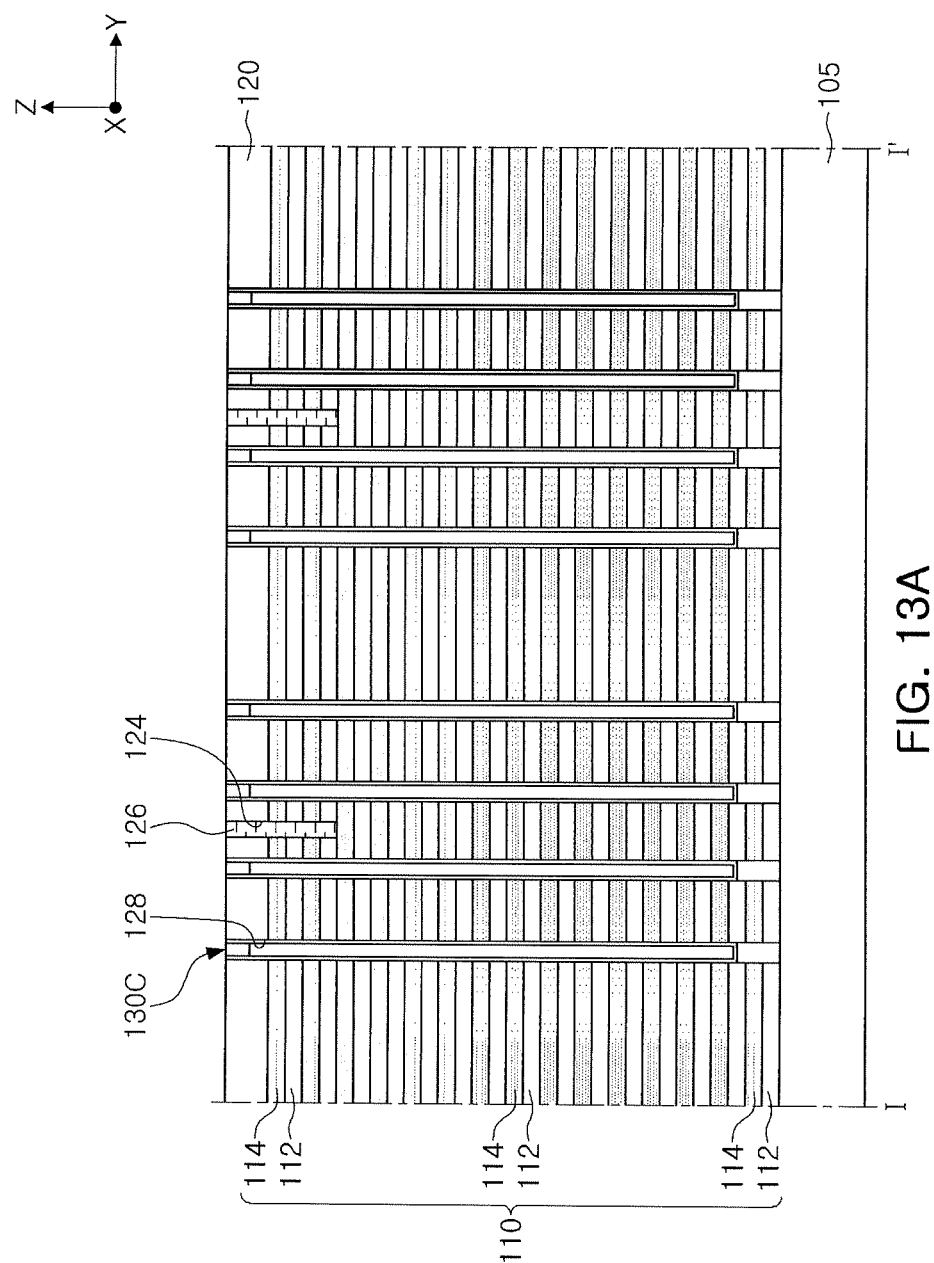
Figure 13B:
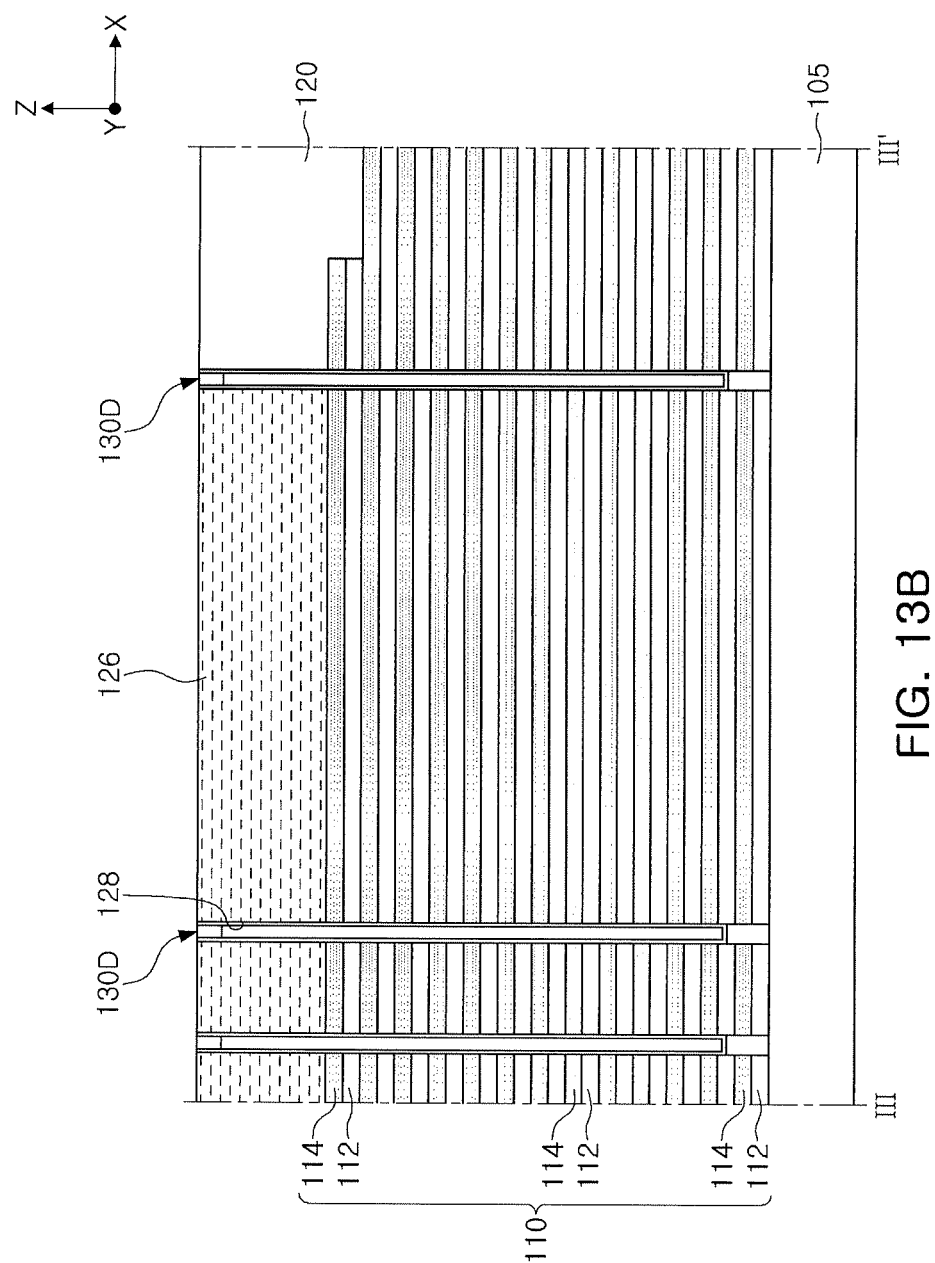

Referring to FIGS. 3, 13A, and 13B, a first capping insulating layer 120 may be formed on the molded structure 110. Grooves 124 may be formed to pass through the first capping insulating layer 120 and an uppermost sacrificial layer and a secondary sacrificial layer among the sacrificial layers 114 of the molded structure 110. The grooves 124 may pass through interlayer insulating layers 112, adjacent to the uppermost sacrificial layer and the secondary sacrificial layer among the sacrificial layers 114. Insulating patterns 126 may be formed to fill the grooves 124. Each of the insulating patterns 126 may have a line shape, extending in the first horizontal direction X.

Vertical structures 130C and 130D may be formed on the semiconductor substrate 105 to extend in a direction perpendicular to the surface 105s of the semiconductor substrate 105. The vertical structures 130C and 130D may include cell vertical structures 130C and dummy vertical structures 130D.

The vertical structures 130C and 130D may be formed to have the same structure as the cell vertical structures 130C described above with reference to FIG. 6. The forming of the vertical structures 130C and 130D may include forming holes 128 to expose the semiconductor substrate 105 while passing through the first capping insulating layer 120 and the molded structure 110, forming semiconductor patterns 132 (refer to FIG. 6) to fill lower regions of the holes 128, forming a first gate dielectric layer 134 (refer to FIG. 6) on each of side surfaces of the holes 128 disposed on the semiconductor patterns 132, forming a semiconductor layer 136 (refer to FIG. 6) to be in contact with the semiconductor patterns 132 while covering the first gate dielectric layer 134, forming core patterns 138 (refer to FIG. 6) on the semiconductor layer 136 to fill a portion of the holes 128, and forming pad patterns 140 (refer to FIG. 6) on the core patterns 138.

Figure 14A:
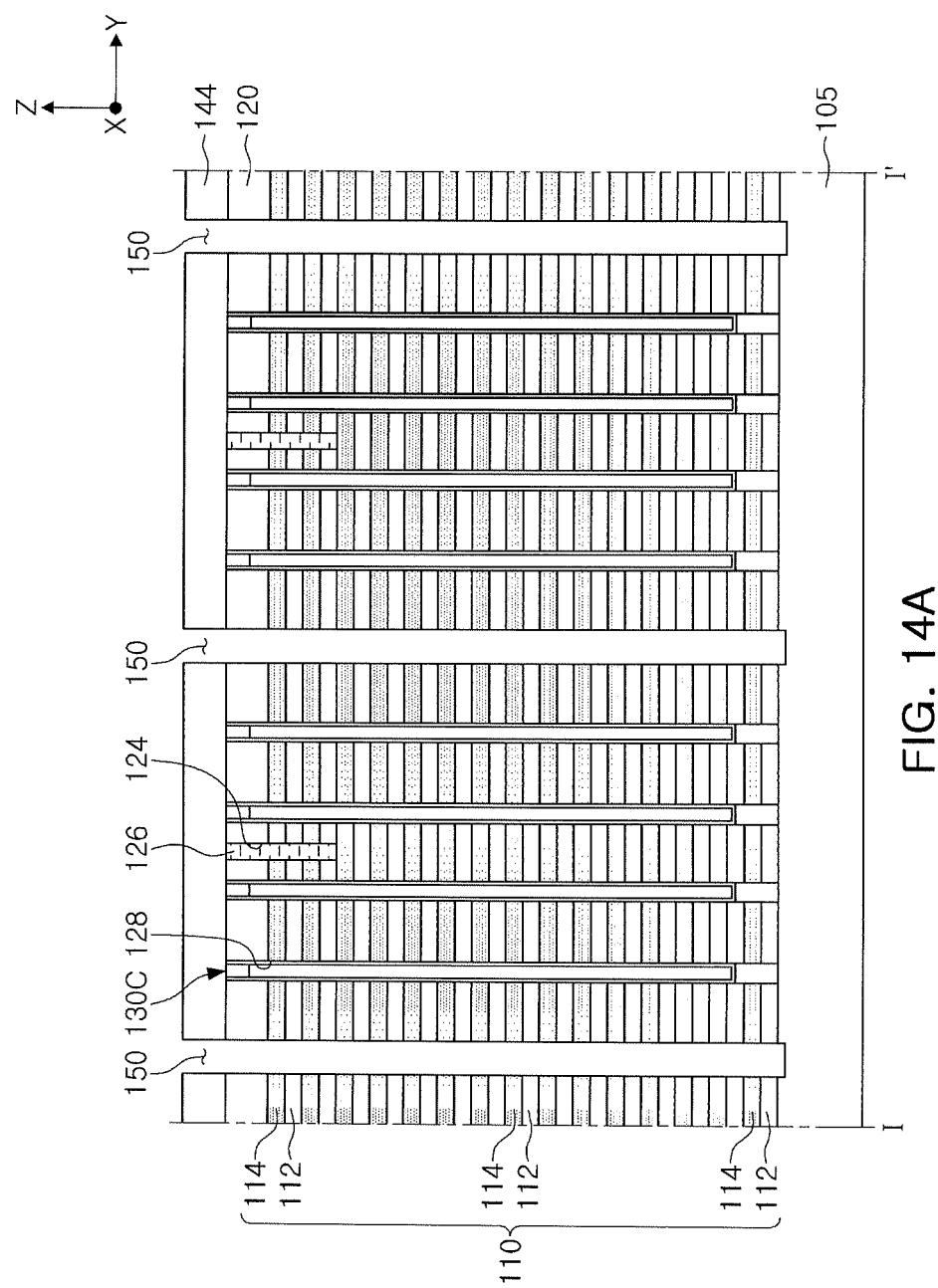
Figure 14B:
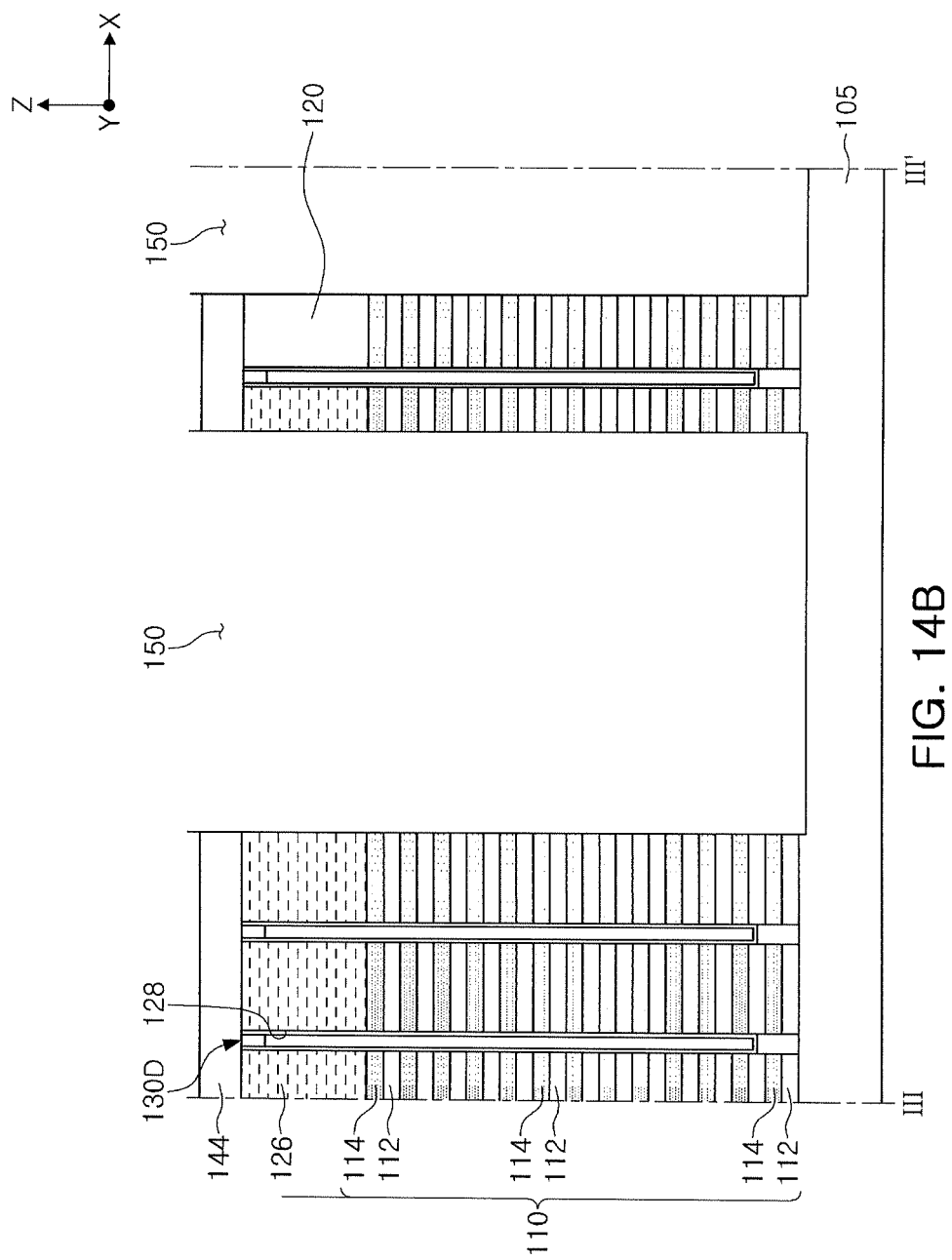

Referring to FIGS. 3, 14A, and 14B, a second capping insulating layer 144 may be formed on the first capping insulating layer 120 to cover the vertical structures 130C and 130D. Trenches 150 may be formed to expose the semiconductor substrate 105 while passing through the first capping insulating layer 120, the second capping insulating layer 144, and the molded structure 110.

Figure 15A:
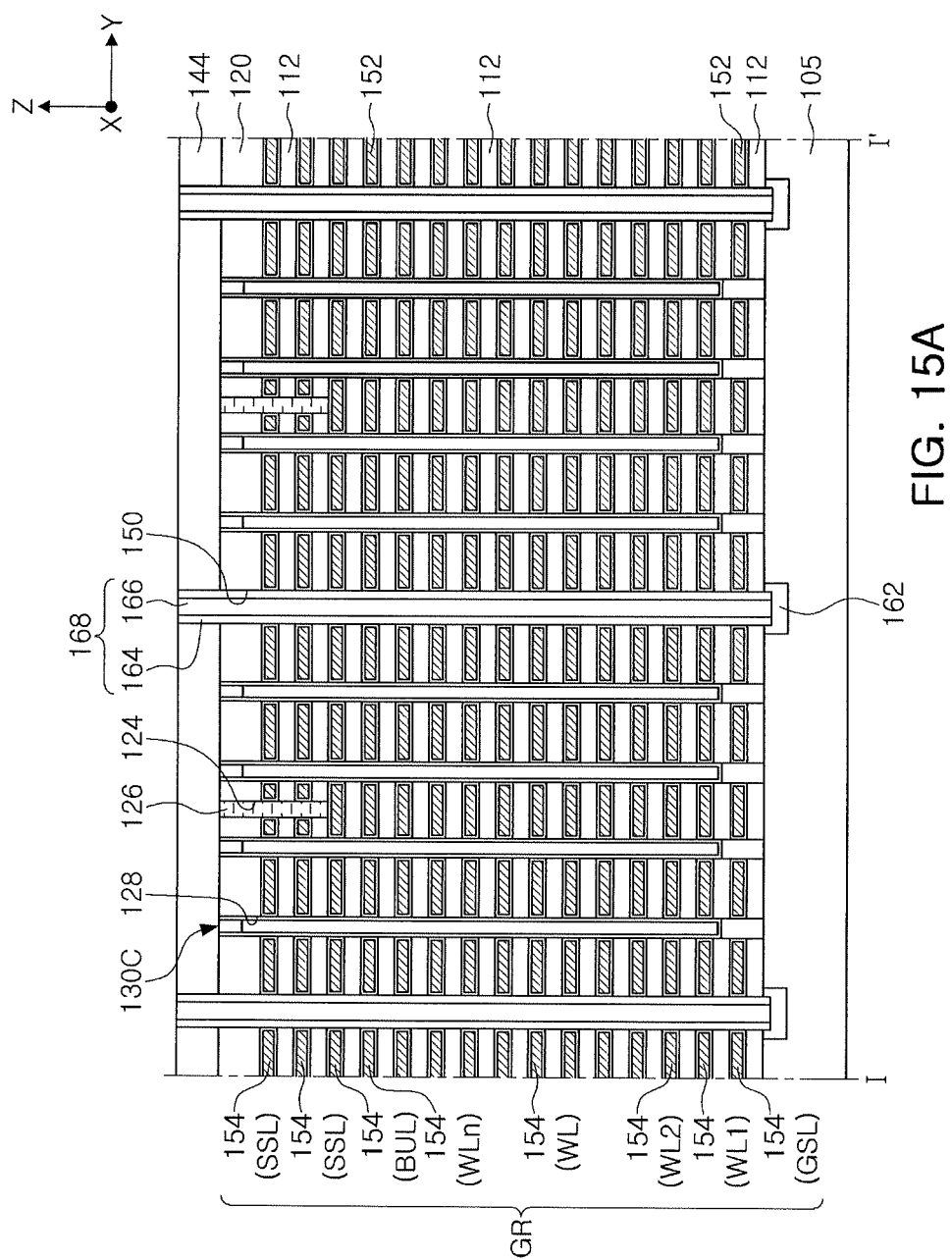
Figure 15B:
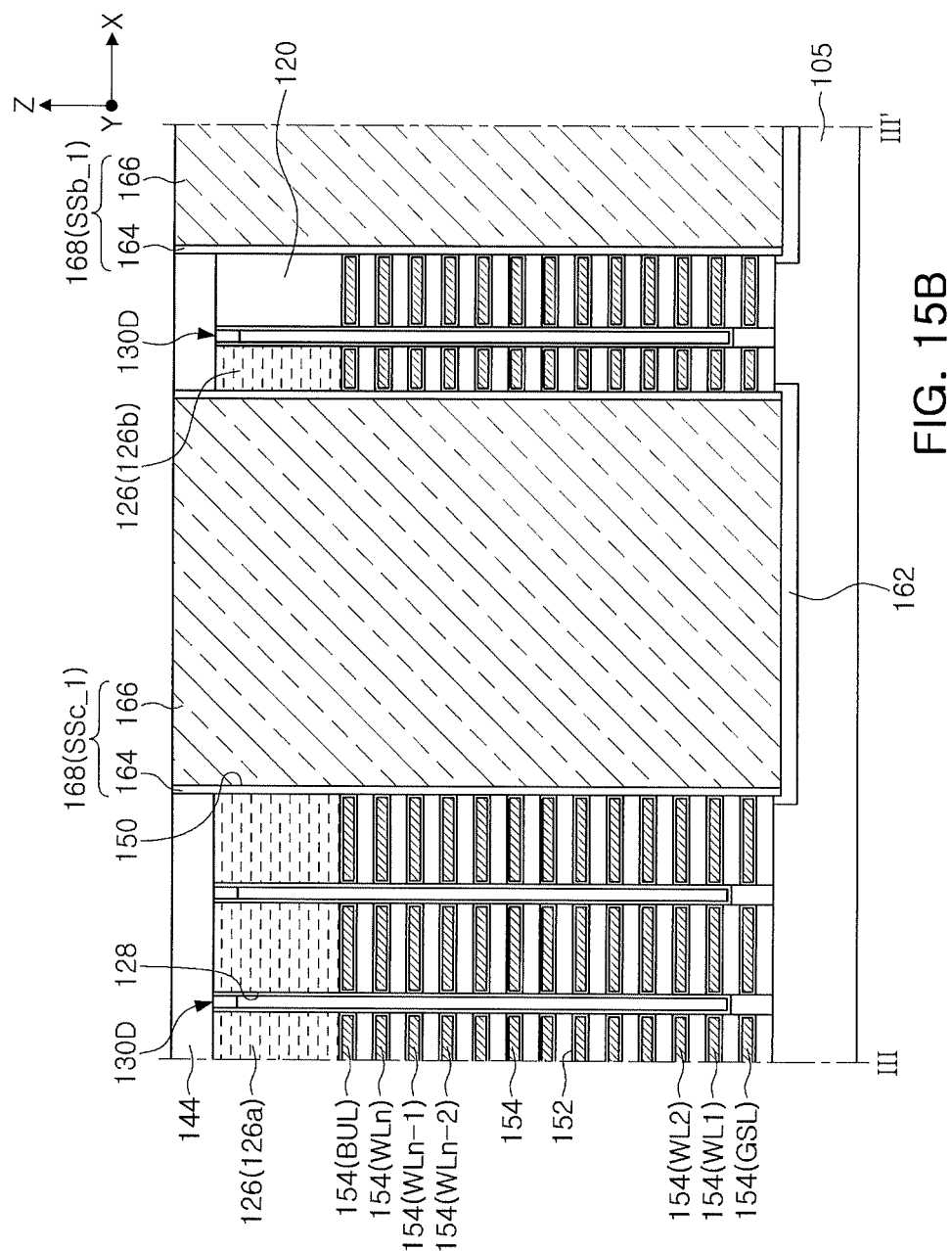

Referring to FIGS. 3, 15A, and 15B, the sacrificial layers 114 of FIGS. 14A and 14B exposed by the trenches 150 may be removed, and second gate dielectric layers 152 and gate electrodes 154 may be sequentially formed within spaces from which the sacrificial layers 114 are removed. The second gate dielectric layers 152 may be formed using an atomic layer deposition (ALD) process.

The gate electrodes 154 may be formed using a chemical vapor deposition (CVD) process. For example, the forming of the gate electrodes 154 may include filling the spaces, from which the sacrificial layers 114 of FIGS. 14A and 14B are removed, with a tungsten material by performing a CVD process using a process gas, such as $WF_6$ or the like.

Insulating spacers 164 may be formed on side surfaces of the trenches 150. Impurity regions 162 may be formed within portions of the semiconductor substrate 105 exposed by the trenches 150. The impurity regions 162 may be formed using an ion implanting process, and may have n-type conductivity.

Source patterns 166 may be formed to fill the trenches 150. The source patterns 166 and the insulating spacers 164 may form the source structures 168.

Referring again to FIGS. 3 and 5A through 5D, a third capping insulating layer 172 may be formed on the second capping insulating layer 144 to cover the source structures 168. An interconnection structure may be formed to be electrically connected to the cell vertical structures 130C.

For example, the forming of the interconnection structure may include forming lower contact plugs 178 of FIG. 6 to be in contact with the cell vertical structures 130C while passing through the second and third capping insulating layers 144 and 172.

As described above, according to example embodiments, the first to third source structures SSb to SSd may be formed between the first and second portions SSa_1 and SSa_2 of the separation source structure SSa to have the end portions, opposing each other. The end portions of the first to third source structures SSb to SSd may be formed to have the planar shape described with reference to FIG. 7 and to oppose each other in the buffer region BA.

In the buffer region BA, the planar shape of the end portions of the first to third source structures SSb to SSd may be formed as described with reference to FIG. 7 to prevent a reduction in thickness of the insulating spacers 164 formed in upper regions of the trenches 150. Thus, the insulating spacers 164 may be prevented from being reduced in thickness. As a result, a defect that may occur between the source patterns 166 and the gate electrodes 154 may be avoided.

Among the word lines WL1 to WLn, any one word line WL disposed on the same plane as the word lines WL1 to WLn may have portions separated from each other by the third source structure SSd in the memory cell region CA, and may have portions separated from each other by the first source structure SSb in the first pad region PA1. The portions of the one word line WL separated from each other in the memory cell region CA and the first pad region PA1 may be integrally connected to each other in the buffer region BA. Thus, in the buffer region BA, the planar shape of the end portions of the first to third source structures SSb to SSd may be formed as described with reference to FIG. 7, to further increase the distance L between the end portions SSb_E1 and SSd_E of the first and third source structures SSb and SSd, thereby increasing a size of a connection portion of the portions of the word line WL integrally connected to each other in the buffer region BA. As a result, electrical characteristics of the word line WL may be increased.

The first to third source structures SSb to SSd may be formed between the first and second portions SSa_1 and SSa_2 of the separation source structure SSa to have the end portions, opposing each other. The trenches 150 for forming the first to third source structures SSb to SSd as described above may allow the process gas for forming the gate electrodes 154 of FIGS. 15A and 15B to flow into the spaces, from which the sacrificial layers 114 of FIGS. 14A and 14B are removed, more easily. Thus, a defect that may occur while the spaces are filled with the gate electrodes 154 may be prevented. As a result, yield and productivity of the semiconductor device may be increased.

As set forth above, according to example embodiments of the present inventive concept, a plurality of source structures, having end portions opposing each other, may be disposed between portions of a separation source structure (SSa) spaced apart from each other while parallel to each other. The source structures, having the end portions opposing each other, may be formed in a pad region. Further, each of the end portions of the source structures may have a planar shape whose width increases and then decreases in a direction toward the other thereof. In the planar shape, a length of a region in which the width increases may be greater than a length of a region in which the width decreases. The source structures, disposed in the pad region, may increase the yield and productivity of semiconductor devices.

While exemplary embodiments have been shown and described above, it will be apparent to those skilled in the art that modifications and variations could be made without departing from the scope of the present inventive concept, as defined by the appended claims.

What is claimed:

1. A semiconductor device, comprising:
a structure including gate electrodes and interlayer insulating layers alternately stacked on an upper surface of a substrate;
a first separation trench and a second separation trench parallel to each other and passing through the structure; and
a groove passing through a portion of the structure, the groove having a width and a length that is greater than the width;
a first trench passing through the structure and contacting the groove; and
a second trench passing through the structure,
wherein the gate electrodes include a plurality of word lines, a first select line and a second select line,
wherein the plurality of word lines are stacked in a vertical direction upwardly from the upper surface of the substrate,
wherein the first and second select lines are on the plurality of word lines, and are spaced apart from each other in a first horizontal direction parallel to the upper surface of the substrate,
wherein a lower end of the groove is at a higher level than a lower surface of an uppermost word line among the plurality of word lines,
wherein a lower end of each of the first separation trench, the second separation trench, the first trench and the second trench is at a lower level than a lowermost gate electrode among the gate electrodes,
wherein the groove, the first trench, the second trench, the plurality of word lines, the first select line and the second select line are between the first separation trench and the second separation trench,
wherein the groove and a portion of the first trench are between the first select line and the second select line, and
wherein the second trench is spaced apart from the groove, the first trench, the first select line and the second select line.

2. The semiconductor device of claim 1, wherein the first trench includes a first end portion, and
wherein the second trench includes a second end portion opposing the first end portion of the first trench in a second horizontal direction.

3. The semiconductor device of claim 2, wherein the first trench further includes a first line portion adjacent to the first end portion,
wherein the second trench further includes a second line portion adjacent to the second end portion,
wherein each of the first line portion and the second line portion has a line shape extending in the second horizontal direction, and
wherein a width in the first horizontal direction of each of the first and second end portions is greater than a width in the first horizontal direction of each of the first and second line portions.

4. The semiconductor device of claim 1, wherein a first distance between an upper end of the first trench and the upper surface of the substrate is greater than a second distance between an upper end of the groove and the upper surface of the substrate.

5. The semiconductor device of claim 1, wherein a width of the first trench is greater than the width of the groove.

6. The semiconductor device of claim 1, wherein a length of each of the first and second separation trenches is greater than a length of each of the first and second trenches.

7. The semiconductor device of claim 1, further comprising:
an insulating material layer disposed in each of the first and second trenches; and
an insulating pattern disposed in the groove,
wherein the insulating pattern in the groove contacts the insulating material layer in the first trench.

8. The semiconductor device of claim 7, further comprising a conductive material layer disposed in each of the first and second trenches,
wherein the insulating material layer is between the conductive material layer and the structure.

9. The semiconductor device of claim 1, wherein the groove has a line shape extending in a second horizontal direction, and
wherein the second horizontal direction is perpendicular to the first horizontal direction and the vertical direction.

10. A semiconductor device, comprising:
a substrate;
a structure including a plurality of gate electrodes and a plurality of interlayer insulating layers alternately stacked on an upper surface of the substrate, wherein the plurality of gate electrodes are disposed in a first region and extend to a second region adjacent to the first region, wherein the plurality of gate electrodes include a plurality of first gate electrodes and a plurality of second gate electrodes on the plurality of first gate electrodes, and wherein the plurality of gate electrodes include gate pads in the second region;
a first separation trench and a second separation trench parallel to each other and passing through the structure in the first region and the second region; and
a plurality of grooves parallel to each other and passing through the plurality of second gate electrodes of the structure;
a plurality of first trenches parallel to each other, contacting the plurality of grooves, and passing through the plurality of the first gate electrodes and the plurality of the second gate electrodes;
a plurality of second trenches parallel to each other, passing through the plurality of first gate electrodes in the second region and spaced apart from the plurality of second gate electrodes, the plurality of grooves and the plurality of first trenches,
wherein the plurality of first gate electrodes are stacked in a vertical direction upwardly from the upper surface of the substrate,
wherein the plurality of second gate electrodes are spaced apart from each other on a same plane,
wherein the plurality of first gate electrodes, the plurality of second gate electrodes, the plurality of grooves, the plurality of first trenches and the plurality of second trenches are between the first separation trench and the second separation trench,
wherein a lower end of each of the plurality of grooves is at a higher level than a lower surface of an uppermost first gate electrode among the plurality of first gate electrodes,
wherein a lower end of each of the first separation trench, the second separation trench, the plurality of first trenches and the plurality of second trenches is at a lower level than a lowermost first gate electrode among the first gate electrodes, wherein each of the first and second separation trenches has a line shape extending in a first direction perpendicular to the vertical direction, wherein a number of the plurality of the second trenches sequentially arranged in a second direction is greater than a number of the plurality of grooves sequentially arranged in the second direction, and wherein the second direction is perpendicular to the vertical direction and the first direction.

11. The semiconductor device of claim 10, further comprising:

cell channel layers passing through the plurality of gate electrodes in the first region;

first contact plugs on the gate pads;

second contact plugs on the cell channel layers; and data storage layers between the cell channel layers and the plurality of gate electrodes.

12. The semiconductor device of claim 10, wherein the plurality of the first trenches and the plurality of the second trenches have end portions opposing each other, and wherein each of the end portions has a planar shape, and a width of each end portion increases and then decreases as each of the end portions extends toward the other.

13. The semiconductor device of claim 10, further comprising:

an insulating material layer in each of the plurality of first trenches; and an insulating pattern in each of the plurality of grooves.

14. The semiconductor device of claim 13, further comprising a conductive material layer disposed in each of the plurality of first trenches, and wherein the insulating material layer is between the conductive material layer and the structure.

15. A semiconductor device, comprising:

a semiconductor substrate having a memory cell region and a pad region adjacent to the memory cell region;

a first separation trench and a second separation trench parallel to each other in a plan view of the semiconductor device and on the memory cell region and the pad region;

a first trench and a second trench disposed between the first and second separation trenches and on the pad region, the first and second trenches having end portions opposing each other on the pad region;

a third trench and a fourth trench disposed between the first and second separation trenches, the third and fourth trenches having end portions opposing each other on the pad region;

a gate group disposed on the memory cell region and the pad region and between the first separation trench and the second separation trench; and a groove between the first separation trench and the second separation trench and in contact with the first trench, wherein each of the end portions of the first and second trenches has a planar shape, and a width of each end portion increases and then decreases as each of the end portions extends toward the other, wherein the gate group includes a plurality of word lines and a plurality of string select lines disposed on the plurality of word lines, wherein the first trench, the second trench, the third trench and the fourth trench pass through the gate group, wherein the first trench is between the first separation trench and the third trench, wherein a length of the third trench is greater than a length of the first trench, wherein a length of each of the first and second separation trenches is greater than the length of the third trench, wherein the plurality of word lines are stacked sequentially on the memory cell region in a vertical direction perpendicular to a surface of the semiconductor substrate, while extending to the pad region, wherein the plurality of string select lines extend from the memory cell region to the pad region and includes a first string select line, a second string select line and a third string select line parallel to each other on the same plane, wherein the groove and a portion of the first trench are between the first string select line and the second string select line, wherein the groove and the first trench are between the first separation trench and the third trench, wherein a lower end of the groove is at a higher level than a lower surface of an uppermost word line among the plurality of word lines, and wherein a lower end of each of the first separation trench, the second separation trench, the first and trench, the second trench, the third trench and the fourth trench is at a lower level than a lowermost word line among the plurality of word lines.

16. The semiconductor device of claim 15, wherein the first trench further includes a line portion integrally connected to the end portion of the first trench, the second trench further includes a line portion integrally connected to the end portion of the second trench, and a width of the line portion of the second trench is greater than a width of the line portion of the first trench.

17. The semiconductor device of claim 15, wherein, in the plan view, a length of a region in the end portions of the first and second trenches for which the width increases is greater than a length of a region in the end portions of the first and second trenches for which the width decreases.

* * * * *